United States Patent
Hauf et al.

(10) Patent No.: US 8,325,322 B2
(45) Date of Patent: Dec. 4, 2012

(54) OPTICAL CORRECTION DEVICE

(75) Inventors: Markus Hauf, Ulm (DE); Ulrich Schoenhoff, Ulm (DE); Payam Tayebati, Riedstadt (DE); Michael Thier, Moegglingen (DE); Tilmann Heil, Aalen (DE); Ole Fluegge, Bartholomae (DE); Arif Kazi, Aalen (DE); Alexander Sauerhoefer, Hamburg (DE); Gerhard Focht, Wilmsdorf (DE); Jochen Weber, Heidenheim-Grosskuchen (DE); Toralf Gruner, Aalen-Hofen (DE); Aksel Goehnermeier, Essingen-Lauterburg (DE); Dirk Hellweg, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 351 days.

(21) Appl. No.: 12/700,122

(22) Filed: Feb. 4, 2010

(65) Prior Publication Data

US 2010/0201958 A1    Aug. 12, 2010

Related U.S. Application Data

(63) Continuation of application No. PCT/EP2008/003616, filed on May 6, 2008.

(60) Provisional application No. 60/957,760, filed on Aug. 24, 2007.

(51) Int. Cl.
  G03B 27/68    (2006.01)
  G03B 27/52    (2006.01)

(52) U.S. Cl. ............................. 355/30; 355/52

(58) Field of Classification Search .......... 355/30, 355/52
See application file for complete search history.

(56) References Cited

U.S. PATENT DOCUMENTS

| | | | |
|---|---|---|---|
| 3,904,274 | A | 9/1975 | Feinleib et al. |
| 4,730,900 | A | 3/1988 | Uehara et al. |
| 4,773,748 | A | 9/1988 | Shih et al. |
| 4,784,476 | A | 11/1988 | Schulman et al. |
| 4,848,881 | A | 7/1989 | Kahan et al. |
| 4,872,743 | A | 10/1989 | Baba et al. |
| 5,036,317 | A | 7/1991 | Buzak |
| 5,359,444 | A | 10/1994 | Piosenka et al. |
| 5,386,427 | A | 1/1995 | Zayhowski |
| 5,390,228 | A | 2/1995 | Niibe et al. |
| 6,041,149 | A | 3/2000 | Monte |
| 6,081,388 | A | 6/2000 | Widl |
| 6,198,579 | B1 | 3/2001 | Rupp |
| 6,307,688 | B1 | 10/2001 | Merz et al. |

(Continued)

FOREIGN PATENT DOCUMENTS

DE       40 42 259    6/1992

(Continued)

OTHER PUBLICATIONS

U.S. Appl. No. 09/321,908, entitled "Catadioptric Projection Objective with Adaptive Mirror and Projection Exposure Method," filed May 28, 1999.

(Continued)

*Primary Examiner* — Thomas R Artman
(74) *Attorney, Agent, or Firm* — Fish & Richardson P.C.

(57) ABSTRACT

The disclosure relates to an optical correction device with thermal actuators for influencing the temperature distribution in the optical correction device. The optical correction device is constructed from at least two partial elements which differ with regard to their ability to transport heat. Furthermore, the disclosure relates to methods for influencing the temperature distribution in an optical element.

20 Claims, 22 Drawing Sheets

U.S. PATENT DOCUMENTS

| | | |
|---|---|---|
| 6,466,382 B2 | 10/2002 | Mueller-Rissmann et al. |
| 6,521,877 B1 | 2/2003 | Mueller-Rissmann et al. |
| 6,690,500 B2 | 2/2004 | Ogasawara et al. |
| 7,019,888 B1 * | 3/2006 | Graves et al. .................. 359/295 |
| 7,064,885 B1 * | 6/2006 | Winzer .......................... 359/291 |
| 7,177,007 B2 * | 2/2007 | Emoto ............................. 355/30 |
| 7,525,640 B2 * | 4/2009 | Jansen et al. ..................... 355/67 |
| 2001/0006429 A1 | 7/2001 | Wals et al. |
| 2001/0038446 A1 | 11/2001 | Takahashi |
| 2002/0048096 A1 | 4/2002 | Melzer et al. |
| 2003/0021040 A1 | 1/2003 | Epple et al. |
| 2005/0146701 A1 * | 7/2005 | Holderer et al. ................ 355/67 |
| 2005/0231677 A1 | 10/2005 | Meredith |
| 2005/0275497 A1 | 12/2005 | Ramadan et al. |
| 2006/0050402 A1 | 3/2006 | Ito et al. |
| 2006/0256419 A1 | 11/2006 | Graf et al. |
| 2007/0019305 A1 | 1/2007 | Ulrich et al. |
| 2007/0222013 A1 | 9/2007 | Lincoln et al. |
| 2008/0106711 A1 | 5/2008 | Beierl et al. |
| 2009/0015785 A1 | 1/2009 | Blum et al. |
| 2009/0257032 A1 | 10/2009 | Eva et al. |
| 2011/0080569 A1 | 4/2011 | Eva et al. |

FOREIGN PATENT DOCUMENTS

| | | |
|---|---|---|
| DE | 198 24 030 | 12/1999 |
| DE | 198 27 602 | 12/1999 |
| DE | 198 59 634 | 6/2000 |
| DE | 10 2005 062 401 | 6/2007 |
| EP | 0 660 169 | 6/1995 |
| EP | 0 678 768 | 2/1996 |
| EP | 0 851 304 | 7/1998 |
| EP | 1 103 857 | 5/2001 |
| EP | 1 191 377 | 3/2002 |
| EP | 1 243 970 | 9/2002 |
| EP | 1 376 185 | 1/2004 |
| EP | 1 376 192 | 1/2004 |
| JP | 60-079357 | 5/1985 |
| JP | 04-142727 | 5/1992 |
| JP | 2001-013297 | 1/2001 |
| JP | 2004-039862 | 2/2004 |
| JP | 2004-246343 | 9/2004 |
| JP | 2005-019628 | 1/2005 |
| JP | 2007-524106 | 8/2007 |
| JP | 2010-504631 | 2/2010 |
| WO | WO 93/01513 | 1/1993 |
| WO | WO 03/075096 | 9/2003 |
| WO | WO 2004/036316 | 4/2004 |
| WO | WO 2005/069055 | 7/2005 |
| WO | WO 2006/025408 | 3/2006 |
| WO | WO 2006/128613 | 12/2006 |
| WO | WO 2008/034636 | 3/2008 |

OTHER PUBLICATIONS

The International Search Report and a Written Opinion from the counterpart PCT Application No. PCT/EP2007/008266, filed Sep. 21, 2007.

Japanese Office Action, with English translation, for corresponding JP Appl. No. 2010-521317, dated Jun. 26, 2012.

* cited by examiner

OPTICAL CORRECTION DEVICE

CROSS-REFERENCE TO RELATED APPLICATIONS

This application is a continuation of, and claims benefit under 35 USC 120 to, international application PCT/EP2008/003616, filed May 6, 2008, which claims benefit of U.S. Ser. No. 60/957,760, filed Aug. 24, 2007. International application PCT/EP2008/003616 is hereby incorporated by reference in its entirety.

FIELD

The disclosure relates to a method for influencing the temperature distribution in an optical element, and an optical correction device with thermal actuators for influencing the temperature distribution in the optical correction device. Furthermore, the disclosure relates to a projection exposure apparatus or a projection objective for semiconductor lithography which contains the optical element according to the disclosure.

BACKGROUND

In modern projection objectives for microlithography, a multiplicity of wavefront manipulators are used for correcting optical aberrations. Most of the manipulators bring about a wavefront correction via mechanical manipulation of the optical elements either via position change or via deformation or both in combination. As has been demonstrated, the manipulators have excellent correction properties for low-order wavefront aberrations such as typically occur when using the objectives in conjunction with so-called conventional settings and at a throughput of approximately 120 wafers/hour.

However, satisfying constantly increasing desired throughput properties involves ever higher light intensities in the objective and thus a constantly increasing thermal load acting on the optical elements. The thermal load causes wavefront aberrations, in the case of lenses predominantly by way of the temperature-dependent refractive index, in the case of mirrors predominantly as a result of the surface deformation on account of the thermal expansion. In addition there is the trend towards extreme illumination settings such as the dipole settings, for example, which entail a strong focusing of the optical power density on lenses near the pupil and can thus also cause higher-order and strongly localized wavefront aberrations. These can only be compensated for to a limited extent via the manipulators mentioned in the introduction. The same applies to wavefront aberrations caused by light-induced lifetime effects such as compaction which arise to an increased extent on account of the higher optical power densities. These wavefront aberrations, too, cannot be efficiently compensated for via the established manipulators. For this reason, these wavefront aberrations caused by lifetime effects are currently compensated for via exchangeable plates to which a specific correction asphere is applied. These compensation plates have to be exchanged repeatedly within the lifetime of the objective in order that the wavefront aberrations are kept small.

SUMMARY

In some embodiments, the disclosure provides a method for correcting optical elements with regard to possible imaging aberrations. In certain embodiments, the disclosure provides an optical element and also a method that permits an electromagnetic radiation incident on the optical element to be influenced at least locally with regard to the radiation parameters. Furthermore, in certain embodiments, the disclosure provides a projection exposure apparatus or a projection objective for semiconductor lithography which can be dynamically corrected with regard to possible imaging aberrations.

The optical element according to the disclosure has at least one electrical conductor track arranged in distributed fashion in the region of the optically active area, the interaction of the optically active area with the electromagnetic radiation incident on the optically active area being able to be influenced by an electrical driving of the conductor track.

The optical thickness of the optical element can therefore be varied by way of the temperature dependence of the optical refractive index. In this case, the phase variation $\Delta\phi$ is proportional to the distance traversed in the optical element s, the temperature sensitivity of the optical refractive index dn/dT and the temperature variation $\Delta T$ $$\Delta\varphi = s\frac{dn}{dT}\Delta T$$

For a given optical geometry, the phase change is approximately proportional to the temperature change. An optical wavefront that passes perpendicularly through a plane-parallel plate experiences a wavefront deformation corresponding to the temperature profile of the optical plate. Conversely, a deformed wavefront can be corrected via a suitable inverse temperature profile. Within the very small temperature range of from typically less than 1 K to a few K, the temperature sensitivity of the refractive index can be assumed to be constant. For a fused silica plate having a thickness of 20 mm, a sensitivity of approximately 0.4 nm/1 mK results, for example, that is to say that a phase effect of 400 nm can be produced with 1 K temperature swing. This is significantly more than the typical amplitudes of high-order wavefront aberrations in projection objective driven at a suitable operating wavelength which is 193 nm or 248 nm. One formulated problem consists, then, in realizing an optical element having a temperature profile that can be set freely. This involves the capability of being able to feed or draw heat to or from the element at any location. However, the desired properties for the optical performance of the projection objectives involves very stringent restrictions with regard to the elements that are permitted to be positioned in the beam path. A maximum permitted homogeneous area coverage of a few thousandths in terms of order of magnitude results for elements near the pupil, and the restrictions are even more stringent for elements near the field. The use of fluid-mechanical heat pumps, for example, is thus precluded.

If, therefore, a conductor track is used for temperature regulation, then it is advantageous if the conductor track has an extent of less than 50 µm at least in sections orthogonally with respect to the direction of incidence of the optical radiation.

Depending on the position of the optical element in the system in which it is employed, smaller dimensions can also be advantageous. In an application in the region of a pupil plane of a projection objective for semiconductor lithography, extents of approximately 1 µm, in particular, are advantageous.

This measure has the effect that, on account of the comparatively small diameter of the conductor track, an impairment of the functionality of the optical element is largely avoided, and that in the case of a suitable spatial distribution of the conductor track, only a small proportion of the optically active surface of the optical element is affected by the measure outlined.

The at least one optically active area of the optical element according to the disclosure includes reflective areas such as e.g. in the case of mirror elements, transmissive areas or area elements such as in the case of lenses, beam splitters, transmission gratings, prisms, or generally refractive optical elements. In general, optically active area denotes that area of the optical element which interacts with electromagnetic radiation to be manipulated by the optical element incident on the area.

The disclosure is therefore suitable in particular for an application in the region of lenses or plane plates through which radiation is transmitted; a use on or else behind the reflective surface of mirrors is likewise conceivable.

The wavelength range of the incident electromagnetic radiation can lie in the optical range through to the extreme ultraviolet range (EUV), that is to say in a spectral range of approximately 10 nm—approximately 1 µm. However, the optical element of the present disclosure can also be applied to electromagnetic radiation which exceeds the wavelength range of 1 µm, such as e.g. in the infrared and far infrared range through to 10 µm.

The at least one electrically conductive conductor track arranged in distributed fashion in the region of the optically active area can be arranged both on the optically active area and below the optically active area within the optical element. The electrically conductive conductor track of the optical element according to the disclosure furthermore includes connection elements for electrically driving the conductor track. Using methods of extremely fine conductor etching from printed circuit board production, optical or electron beam lithography or via laser microstructuring, it is possible to produce the conductor tracks down to a minimum extent of approximately 10 nm.

In the case of the application of the disclosure to optical elements used in a projection objective for semiconductor lithography, the following estimation can be made: bubble classes up to 5×0.25 are usually permitted depending on the position of the optical element in the objective. This corresponds to a total area of 1.25 mm². According to ISO 10110-3 it is permitted for this area to be distributed between more bubbles of an equivalent total area as long as no clustering occurs. To a first approximation it would therefore be permissible to distribute a conductor track having a length of up to 1.25 m and a width of 1 µm over the optical element. If appropriate, it can be ensured by virtue of irregularities in the x-y distribution or the width and the cross-sectional form of the conductor track that systematic effects such as influencing of specific diffraction orders or directional scattered light do not occur.

The optical element according to the disclosure permits supervision of the wavefront of the electromagnetic radiation with a spatial resolution similar to that when using correction aspheres produced via ion beam figuring, although in contrast to the conventional procedure the setting can be changed dynamically within a few seconds.

The complicated production and integration of the above-mentioned correction aspheres can be replaced by the use of previously calculated static heating profiles. Various preprogrammed nanoaspheres can likewise be "switched in" dynamically, which can serve for improving the resolution in specific applications. Profiles which are calculated in advance and, if appropriate, derived from measurement data can in this case correct lifetime aberrations on account of compaction/rarefaction (i.e. local changes in the density of the material of the optical element), or strained holders of the optical elements. In interaction with information from a control computer about the present operating mode of the system in which the optical element according to the disclosure is used, however, lens heating, i.e. local changes in density or surface deformations on account of the heating of the optical element, can also be compensated for dynamically. Furthermore, an automatic feedback loop in which data from wavefront sensors are used directly for deriving the desired heating profile is also conceivable.

In some embodiments, the optical element has at least one partly transparent and/or reflective active optical area. In this case, the optical element can be formed as a beam splitter cube, beam splitter plate, plane-parallel plate, wedge or generally as a refractive optical element (ROE). The optical element according to the disclosure can be formed as a lens, e.g. as a converging lens, diverging lens, Fresnel lens or Fresnel zone plate. The optical element according to the disclosure can also be an at least partly reflective element, e.g. a beam splitter device. Furthermore, the optical element according to the disclosure can be realized as a diffractive optical element, such as e.g. in the form of a reflection or transmission grating.

The at least one conductor track of the optical element according to the disclosure can have a diameter or a cross-sectional dimension of <50 µm at least in sections; optionally, the diameter or the cross-sectional dimension lies between 0.05 µm and 1 µm.

Via the at least one electrically conductive conductor track of the optical element according to the disclosure that is arranged in a manner distributed in the region of the active optical area, the optical element can advantageously be heated locally in the vicinity of the active area via electrical power, such that the optically active area can be altered in a controllable manner with regard to its form or other parameters on account of the heat input. Typically, the temperature change due to the heating is some mK. It is thus possible to control the effect of the active area on the light incident on the active area or of the electromagnetic radiation incident on the active area with the electrical power input via the electrically conductive conductor track. This can advantageously be used to correct imaging aberrations caused by lens aberrations, for example, in an optical imaging system such as e.g. a projection exposure apparatus.

In an alternative method according to the disclosure for influencing the temperature distribution in an optical element, heat is fed to the optical element in a locally defined manner via one or more heat sources, the heat being drawn from the optical element via one or more heat sinks. In this case, a locally defined feeding of heat is understood to mean the inputting of a specific quantity of heat into a specific volume element of the optical element. In this case, the average temperature of the optical element is kept substantially, that is to say e.g. within a few hundred mK, constant. In this case, the (average) temperature of the heat sink lies below the lowest temperature that is to be set locally for the optical element.

In this case, resistance heating elements can be used for the locally defined feeding of heat; it has been found to be advantageous if a constant average temperature of the heat sink, depending on the desired heat loss, is chosen to be approximately a few 100 mK to a few 10 K below the average temperature of the optical element. Both the temperature distribution and the average temperature in the optical element can be influenced via a closed-loop control or an open-loop control.

The heat sink can be formed as a water-cooled element, evaporative cooler, gas expansion cooler or thermoelectric element.

Furthermore, it has proved worthwhile to decouple the heat sink mechanically from the optical element formed for example as a lens; in particular, a vibration decoupling is desirable.

The use of heating elements actively controlled by open-loop or closed-loop control exhibits some advantages in this case. Since a resistance heating element is a unipolar element which exclusively effects heating, such that the resistance heating element is easy to control by open-loop or closed-loop control. In other words, the heating elements effect heating continuously relative to a passive cooling of the optical element; the cooling can be realized in particular by the optical element being linked to a heat sink having a sufficiently low temperature via suitably dimensioned thermal resistors. In this case, the temperature of the heat sink ideally lies below the minimum desired temperature of the heat distribution over the optical element. This arrangement has the effect that the heat input from the resistance heating elements, for example, counteracts the heat loss caused by the thermal resistors. Depending on the set heating power of the resistance heating elements, there arises at the linking point of the heating element at the optical element an undercompensation, a compensation or else an overcompensation of the heat losses caused by the thermal resistors, which corresponds to a negative, neutral or positive heat power balance at the linking points at the optical element. In other words, the local cooling or heating of the optical element, according to the teaching of the disclosure, is ensured by undercompensation or overcompensation of heat losses relative to a heat sink kept at a lower temperature.

Within the very small temperature variations of a few kelvins or less that are desired for obtaining an optical effect in the range of a few hundred nm, the thermal constants of the materials used can be assumed to be constant and the heat transfer equations can therefore be assumed to be linear in terms of the temperature. The proportionality constants for heat flow and temperature difference are given by the effective thermal conductances (1/thermal resistance). The resistance heating elements used permit the heat input to be controlled by open-loop or closed-loop control by way of the applied current linearly very precisely and with short reaction times. Since the total power fed is converted into heat in a resistance heating element, resistance heating elements of this type can be supervised easily with regard to the quantity of heat fed.

The advantageous behaviour of the resistance heating elements as outlined opens up the possibility of realizing the temperature distribution in the optical element via an open-loop control instead of via a closed-loop control. Analogously, the average temperature of the optical element can likewise be set via an open-loop control. In this case, the steady-state temperature offset over the temperature of the heat sink can be determined precisely via the quotient of the sum of all heating powers fed and the sum of the thermal conductances of the coupling resistors. In this way, the use of temperature sensors is unnecessary or the possibility of using comparatively few temperature sensors is afforded.

It is furthermore advantageous that at a constant average temperature of the optical element, the heat power output to the heat sink via the thermal resistors always remains constant within a few per mill, independently of the amplitude of the temperature distribution in the optical element. This considerably facilitates the stabilization of the temperature of the heat sink; furthermore, the constancy of the power loss into the heat sink also contributes to avoiding side effects on other components since the thermal flow towards the outside is independent of the amplitudes of the temperature distribution set. Furthermore, resistance heating elements are compact, they act locally and therefore open up the possibility of forming arrays and they are reliable. Furthermore, resistance heating elements are cost-effective and exhibit a long lifetime.

A water-cooled element, embodied for example as a ring or plate depending on the desired properties, can serve as a thermal heat sink. However, the use of a gas expansion cooling or an evaporative cooling in a sealed volume or else the use of thermoelectric elements for the heat sink also appear to be conceivable. Care should be taken to ensure that a low-vibration cooling of the heat sink is realized, in order that no mechanical disturbances are input into the overall system by the cooling. For this purpose, the heat sink can be decoupled for example mechanically from the rest of the structure, such that the input of vibrations is also minimized as far as possible.

An alternative to the solution described above consists in the optical element according to the disclosure being constructed from at least two partial elements which differ with regard to their thermal conductivity. In this case, one of the two partial elements, in particular the partial element having the lower thermal conductivity, can be provided with thermal actuators, in particular heating elements.

The partial elements can be, in particular, plate- or lens-type elements.

In an edge region of the optical element, a heat reservoir formed for example as a heat sink can be arranged for the purpose of compensating for the temperature differences input by the thermal actuators, in particular for the purpose of dissipating the heat input by the heating elements.

It has proved worthwhile in this case if the partial element having the higher thermal conductivity has a lower, in particular an opposite temperature dependence of the refractive index with regard to the partial element having the lower thermal conductivity. This can be achieved in particular by virtue of the first partial element containing quartz and the second partial element containing $CaF_2$.

In order to accelerate the setting of a steady-state equilibrium in the optical element, it is advantageous for those thermal actuators which are arranged in an edge region of a partial element to be driven earlier or to a greater extent than those actuators which are arranged in an inner region of the optical element.

The disclosure is explained in more detail below on the basis of some exemplary embodiments. In the figures.

Figure 23:
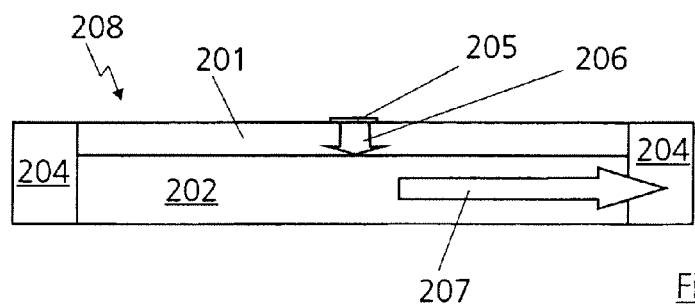
Figure 24:
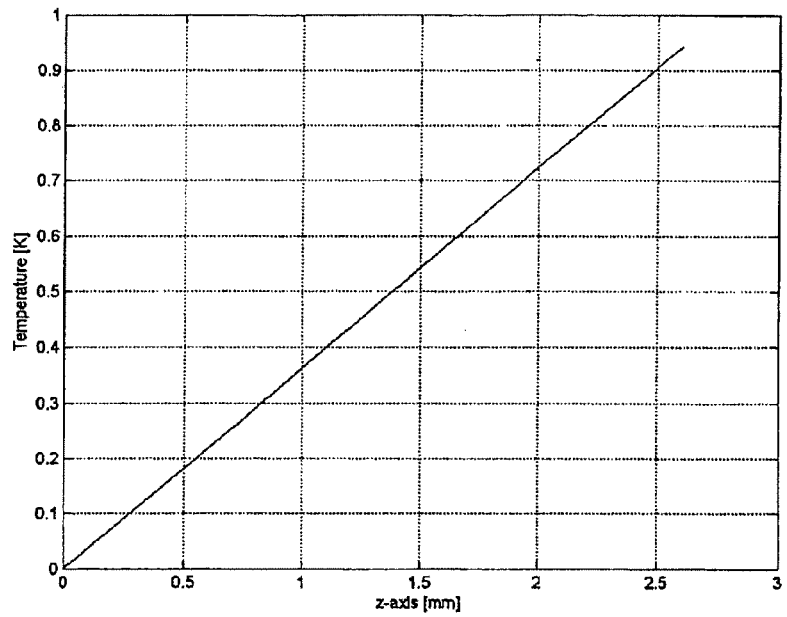
Figure 25:
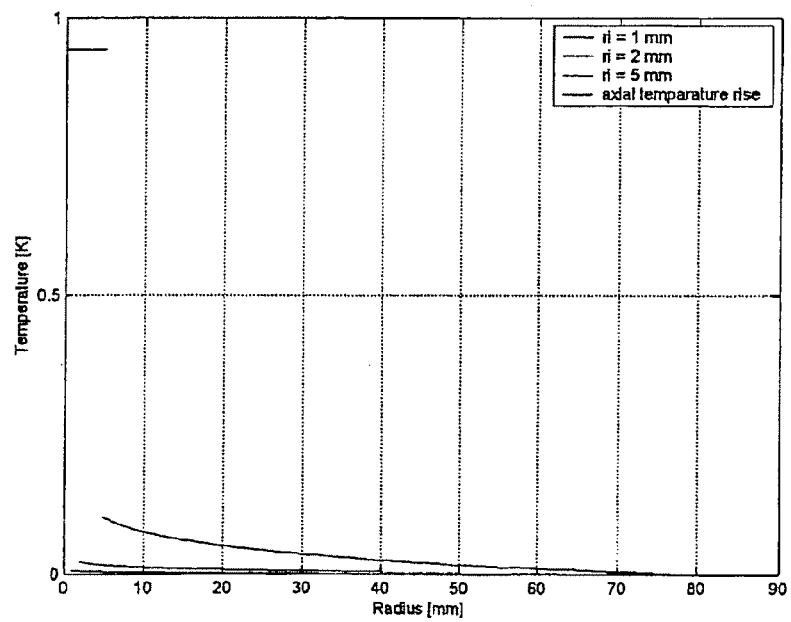
Figure 26:
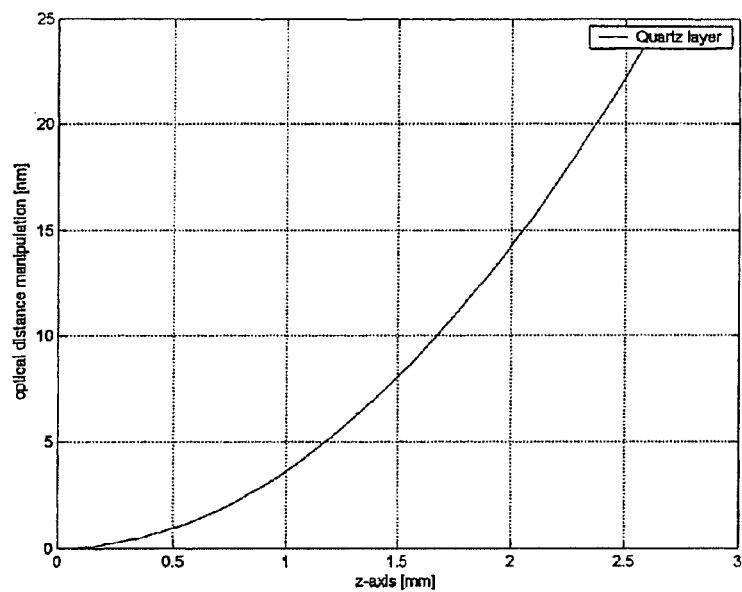
Figure 27:
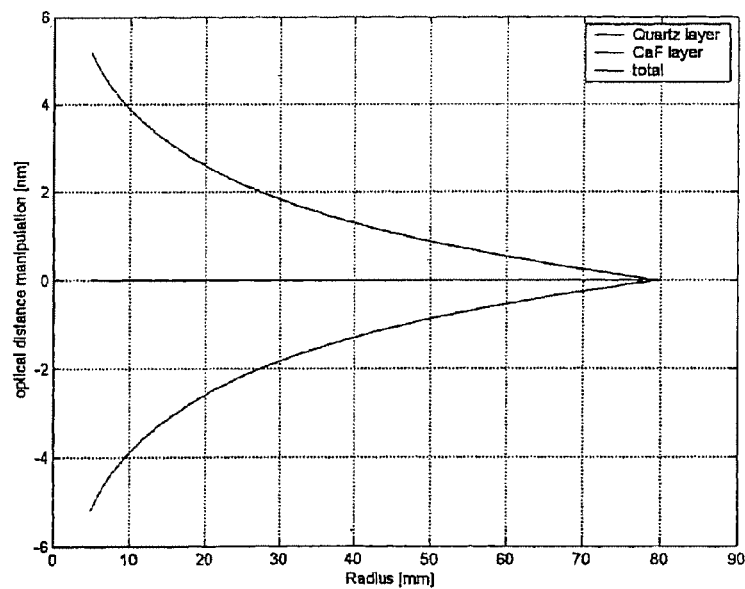
Figure 28:
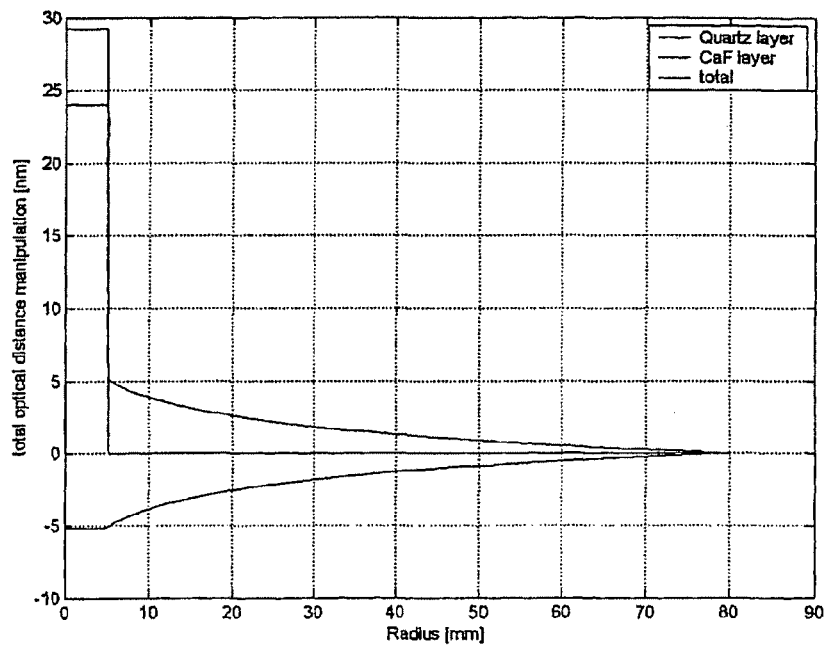
Figure 29:
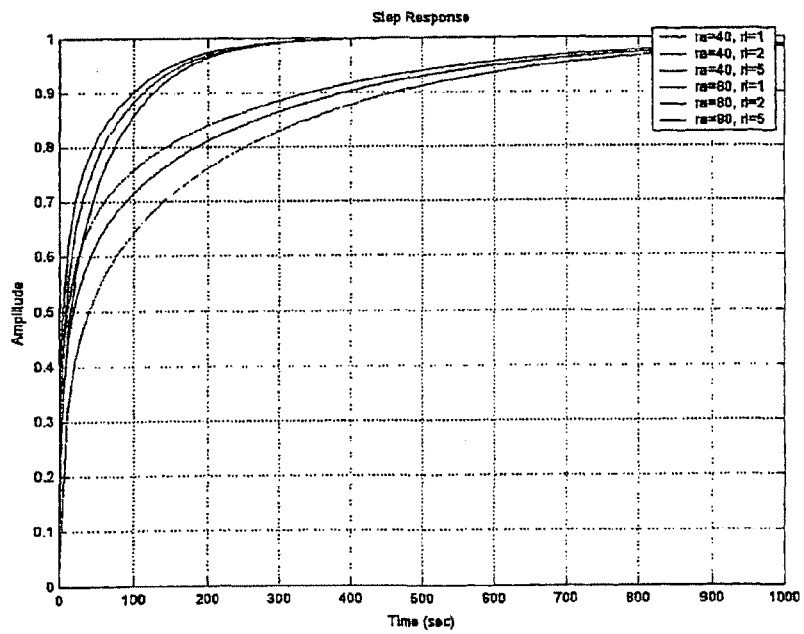
Figure 30:
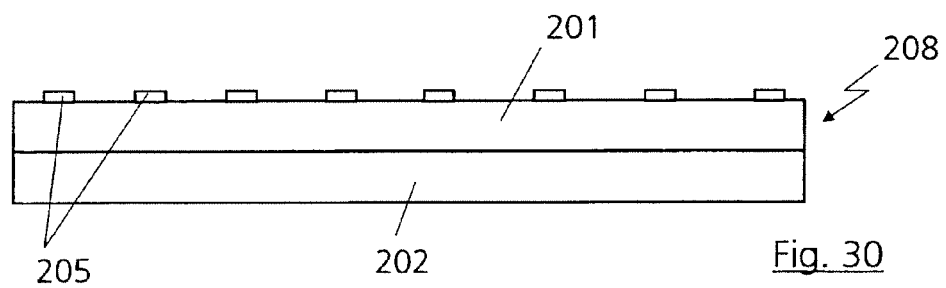
Figure 31:
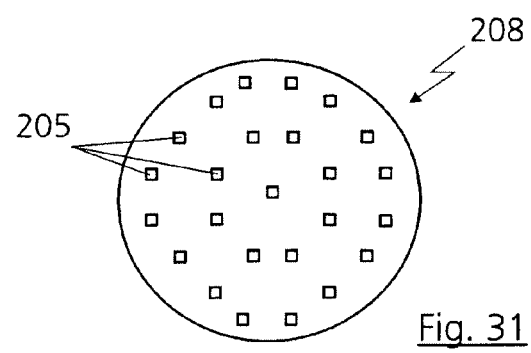
Figure 32:
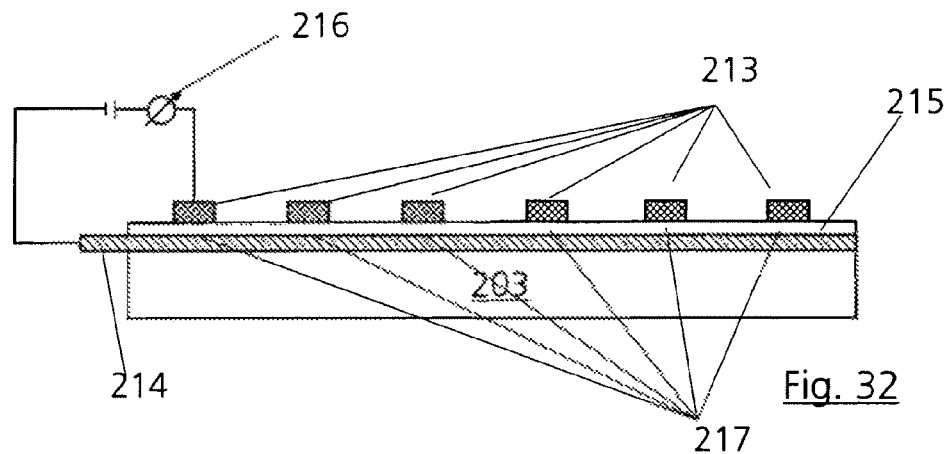
Figure 33:
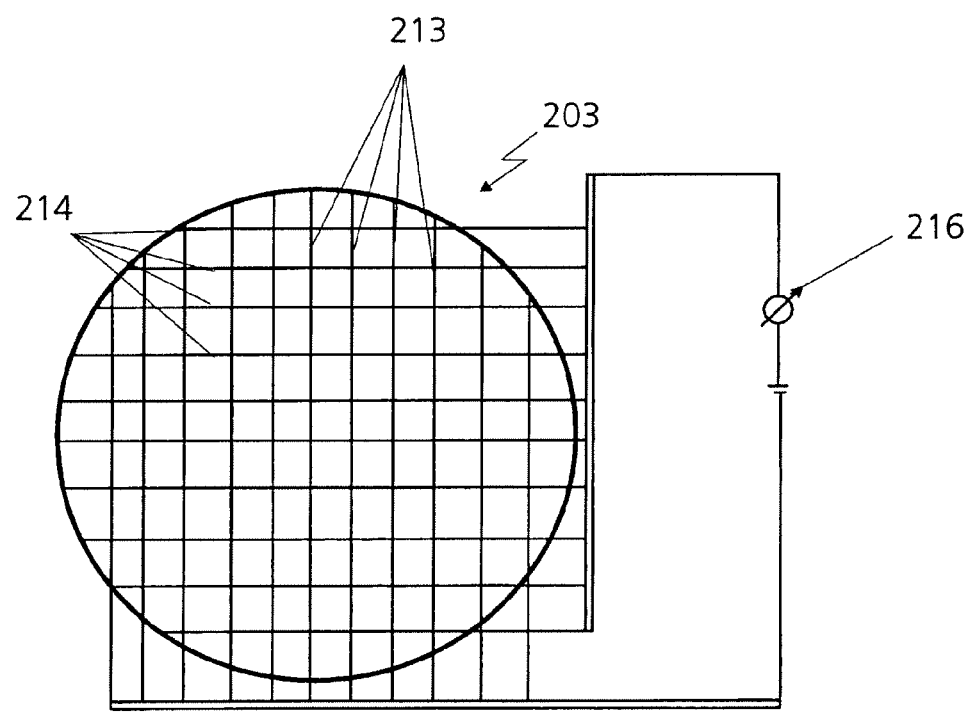
Figure 34:
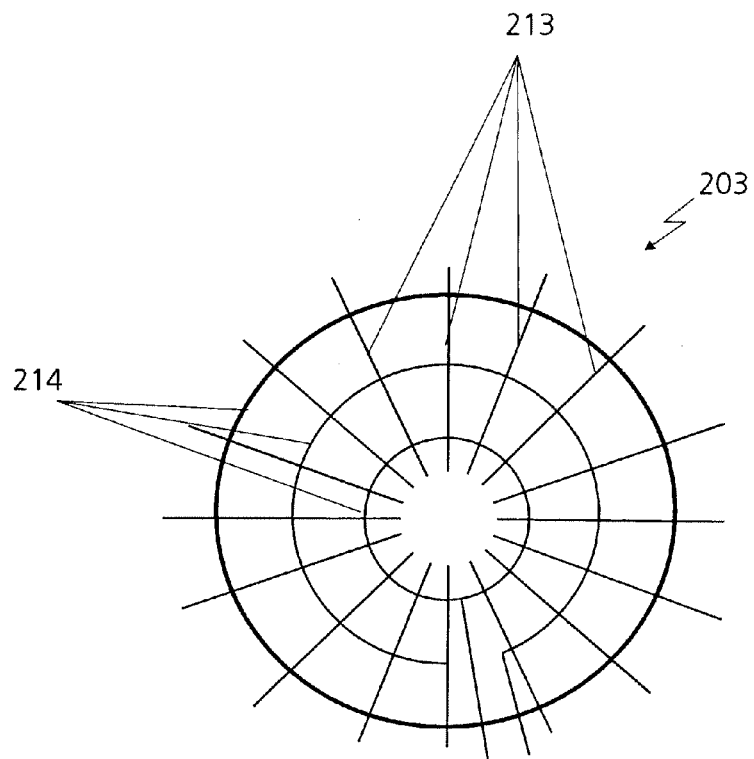
Figure 35A:
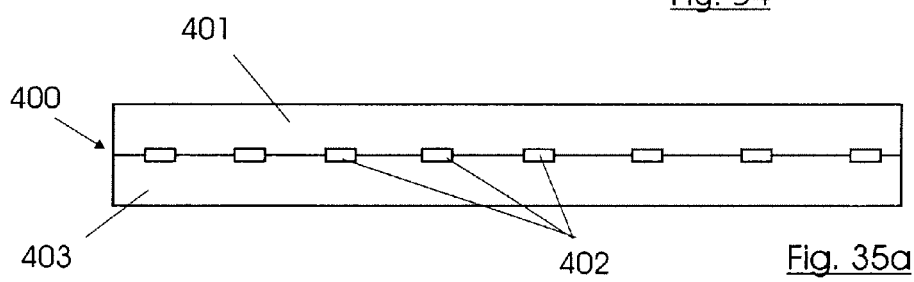
Figure 35B:
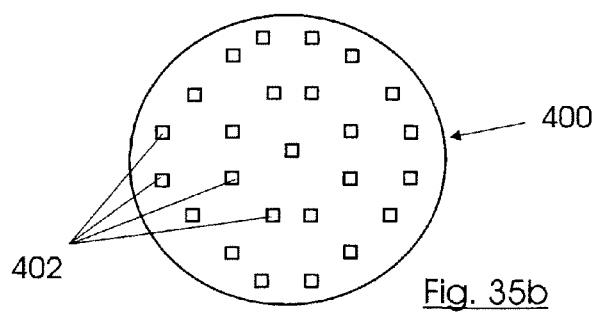
Figure 36:
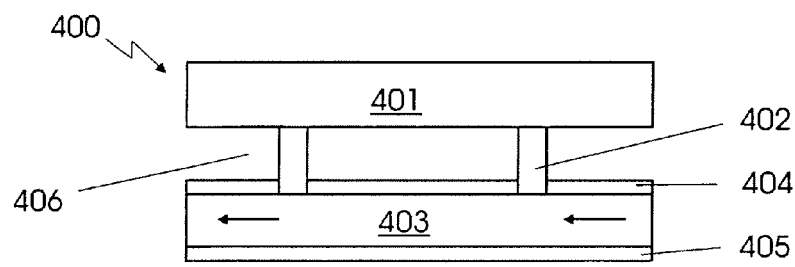
Figure 37:
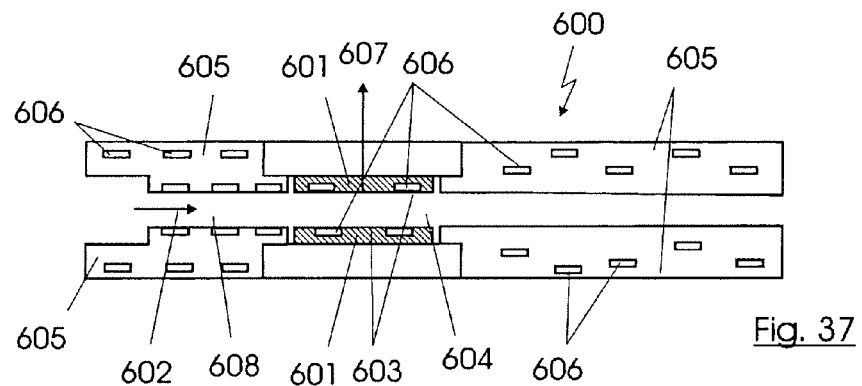
Figure 38:
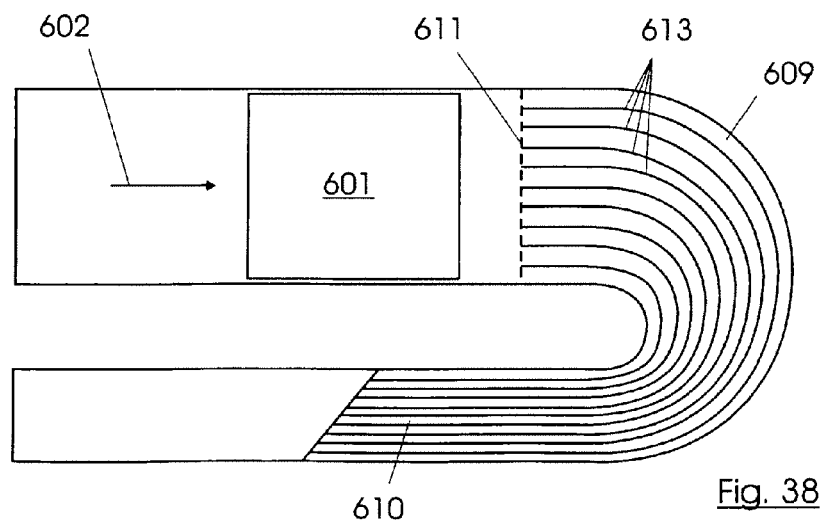
Figure 39:
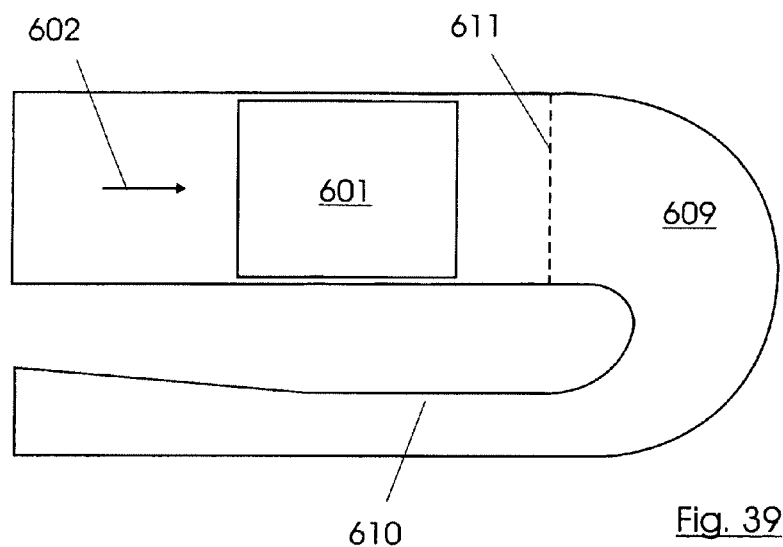
Figure 40:
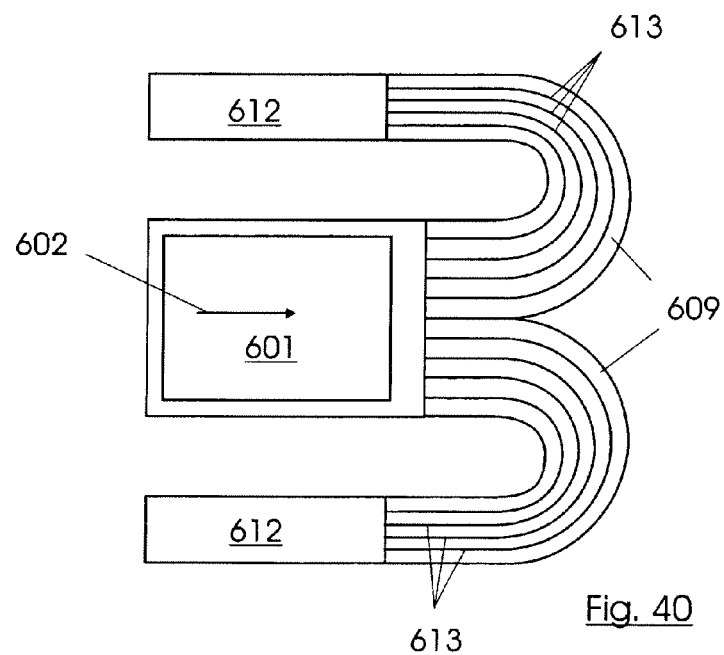
Figure 41:
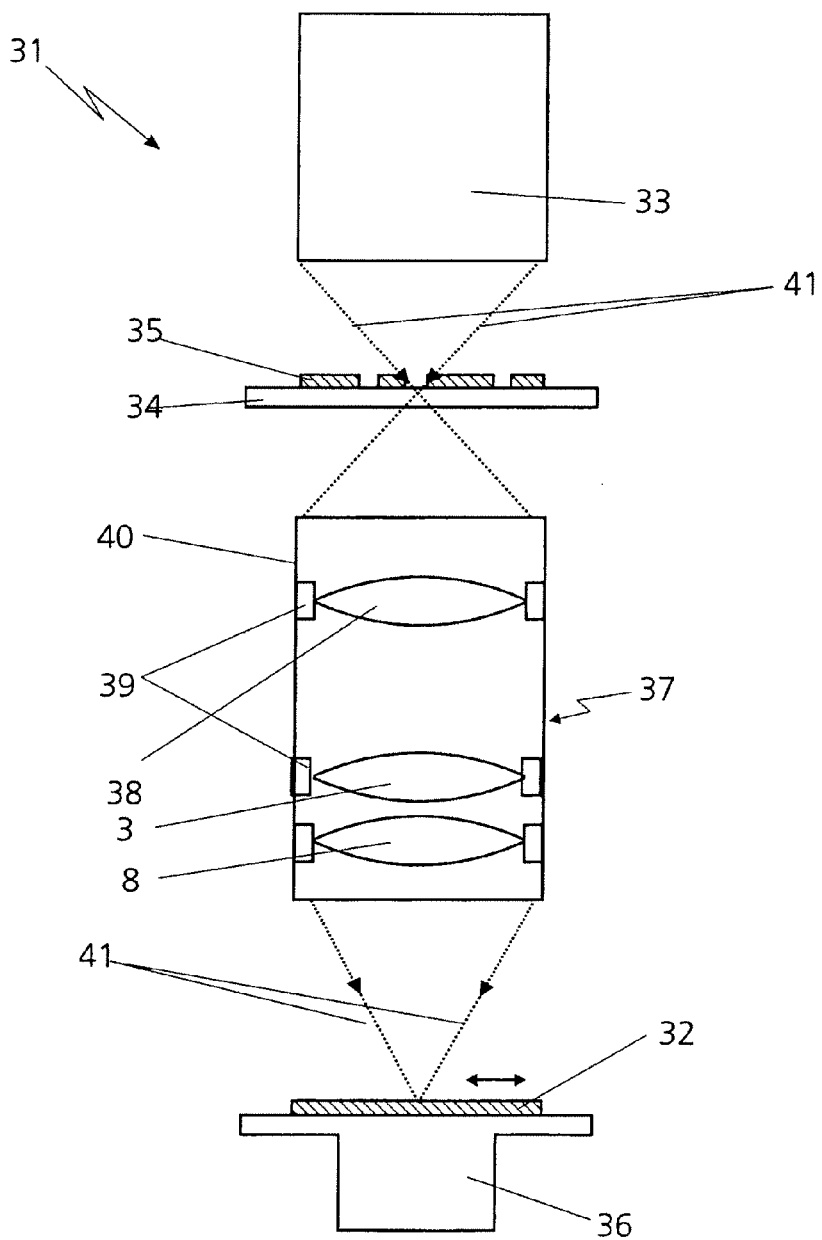
Figure 42:
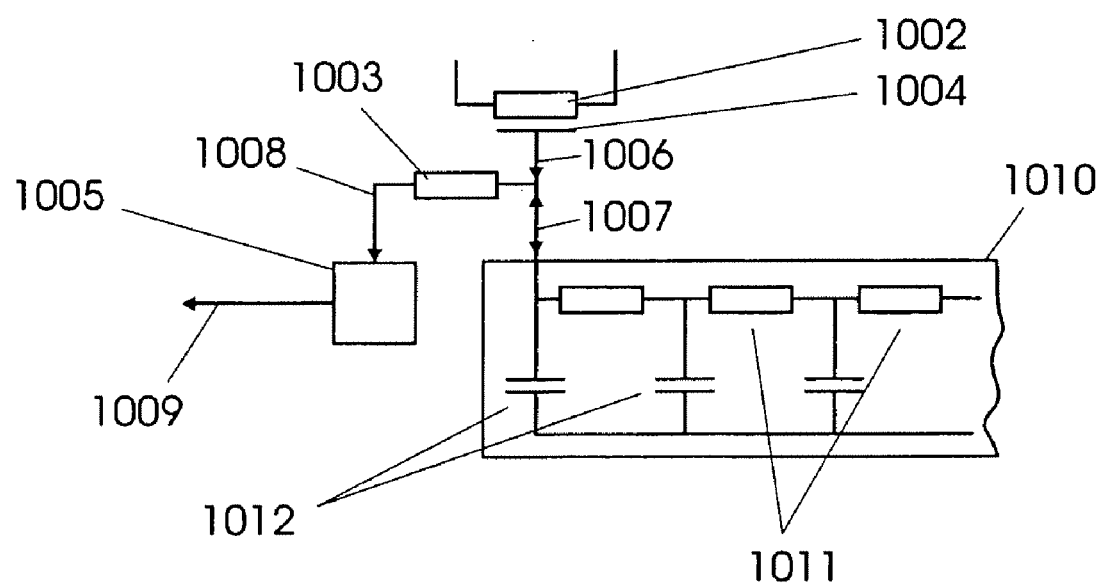

FIG. 23 shows a schematic illustration of an alternative optical element according to the disclosure including two partial elements, FIG. 24 shows an illustration of the local axial temperature distribution in a partial element, FIG. 25 shows the radial temperature distribution in both partial elements, FIG. 26 shows the influencing of the optical path length in one of the partial elements, FIG. 27 shows the influencing of the optical path length in the other partial element, FIG. 28 shows the optical action of the optical element according to the disclosure, FIG. 29 shows the normalized step response of the temperature at the edge of the heated region, FIG. 30 shows an exemplary embodiment of the disclosure in which the second partial element is formed by a layer of water, FIG. 31 shows an overview of an exemplary distribution of the thermal manipulators, FIG. 32 shows a further possibility for changing the temperature profile of an optical element, FIG. 33 shows an exemplary arrangement of thermal actuators on an optical element, FIG. 34 shows a further exemplary arrangement of thermal actuators on an optical element, FIG. 35 shows, in subfigures 35a and 35b, an alternative design of a manipulator, FIG. 36 shows a variant of the manipulator according to the disclosure that is improved further in comparison with the solution presented in FIG. 35, FIG. 37 shows a further exemplary arrangement according to the disclosure, in which an optically transparent two-dimensional array of controllable heat sources and/or heat sinks is realized by heat being drawn permanently via a cold gas flow at the two optical elements at an interface across the entire thermal area to be actuated, FIG. 38 shows an alternative embodiment of the arrangement shown in FIG. 37 with regard to the guidance of the gas flow, FIG. 39 shows a further alternative embodiment of the arrangement shown in FIG. 37 with regard to the guidance of the gas flow, FIG. 40 shows a variant with a gas flow divided into two, FIG. 41 shows a projection exposure apparatus for semiconductor lithography into which the optical elements described in the above exemplary embodiments are integrated, and FIG. 42 shows one of the principles underlying the disclosure on the basis of a thermal equivalent circuit diagram.

Figure 1:
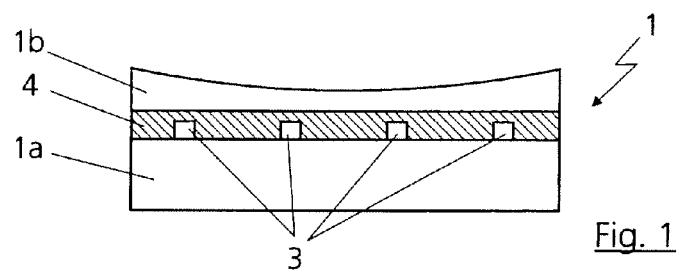
FIG. 1 shows an optical element constructed in two parts.

FIG. 1 shows an optical element 1 constructed in two parts from a first substrate 1a and a second substrate 1b. In this case, the conductor tracks 3 are arranged on the first substrate 1a. The second substrate 1b is connected to the first substrate 1a via a thin cement layer 4; in this case, the cement layer 4 also serves to compensate for the height difference caused by the conductor tracks 3 on the surface of the first substrate 1a. The optical element 1 can be, in particular, a lens, a mirror, a beam splitter device or else an optical element having a diffractive structure.

Figure 2:
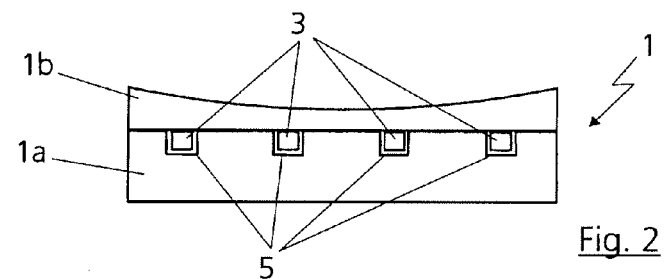
FIG. 2 shows a first variant of the disclosure.

FIG. 2 shows a variant in which the conductor tracks 3 are arranged in cutouts 5. In this case, the cutouts 5 may have been produced via an etching method, in particular. This variant has the advantage that the first substrate 1a can be connected to the second substrate 1b without the use of a cement layer. Thus, by way of example, the second substrate 1b can be connected to the first substrate 1a by wringing.

Figure 3:
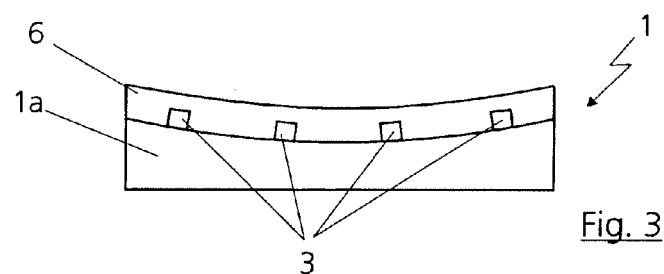
FIG. 3 shows an exemplary embodiment of the disclosure in which the conductor tracks are applied to the finished polished surface of a substrate.
Figure 4A:
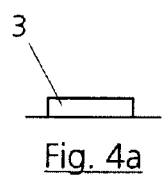
FIG. 4 shows different variants of the cross-sectional profile of the conductor tracks.
Figure 4B:
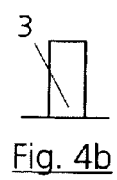
Figure 4C:
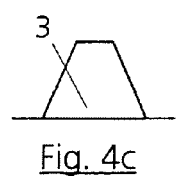
Figure 4D:
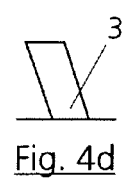

FIG. 3 shows an exemplary embodiment of the disclosure whose realization is associated with little outlay. In this case, the conductor tracks 3 are arranged on the polished surface of the substrate 1a. The substrate 1a and also the conductor tracks 3 are covered by the optical layer 6. The optical layer 6 can be, for example, an antireflection layer or else—in the case where a mirror is used as optical element 1—a highly reflective layer. In order to produce the exemplary embodiment from FIG. 3, the optical layer 6 is applied to the substrate 1a already provided with conductor tracks 3; it covers the optical surface of the substrate 1a and the conductor tracks 3.

There are various possibilities for the configuration of the conductor tracks 3, some of which are illustrated in FIG. 4. Etched or vapour-deposited conductor tracks 3 are usually flat, as illustrated in FIG. 4a. In order to reduce the optical cross section, however, a profile of the conductor track 3 in which the conductor track 3 is higher than it is wide can also be chosen for a given resistance value; this case is illustrated in FIG. 4b. For the cases in which the beam path is divergent at the relevant location of the optical element 1, a trapezoidal cross section of the conductor tracks 3 can also be chosen, as outlined in FIG. 4c. For regions at the edge of the optical element 1 where the optical radiation is incident predominantly obliquely, the profile of the conductor tracks 3 can be formed in a manner inclined towards the centre of the optical element 1, as illustrated in FIG. 4d. Moreover, it is conceivable for the edges and corners of the profile of the conductor track 3 to be configured in rounded or irregular fashion, whereby scattering can be reduced or smeared over wide angular ranges.

Figure 5A:
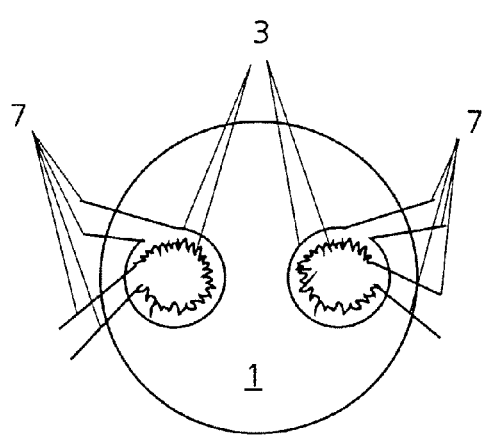
FIG. 5 shows an exemplary embodiment of the disclosure in which regions having high energy density gradients are simulated.
Figure 5B:
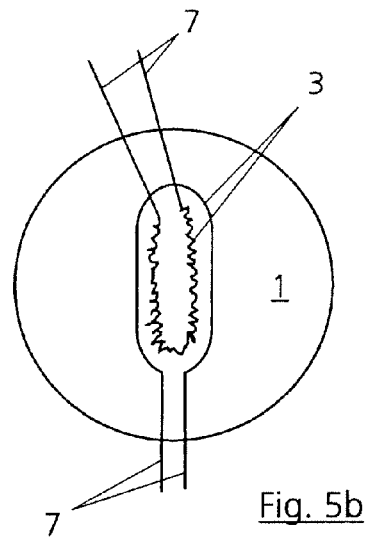

FIG. 5 shows a case in which regions of high energy density gradients are imaged. Here the case of FIG. 5a relates to an illumination setting in the form of a dipole in the case where the optical element 1 is used in a projection exposure apparatus for semiconductor lithography. In the case illustrated in FIG. 5a, the conductor tracks 3 are concentrated on the region to which the optical radiation is particularly applied in the case of a dipole setting. FIG. 5a likewise illustrates the connecting wires 7 used to make contact with the conductor tracks 3 arranged in the optical element 1. FIG. 5b shows a variant for a position of the optical element in which the scanner slot effects good imaging virtually independently of the illumination setting. The conductor tracks 3 and the connecting wires 7 in the optical element 1 are illustrated here, too. For the case where the conductor tracks 3 are used as heating wires, the density of the heating of the optical element 1 can be varied by varying the splitting of the conductor tracks 3 or the coiling thereof as illustrated in FIG. 5a and FIG. 5b. In this case, the coiling may be a lateral variation in the sense of a lateral zig zag course of the conductor tracks 3; furthermore, it is also conceivable for the coiling to be formed three-dimensionally, for example in the manner of a helical spring.

Figure 6:
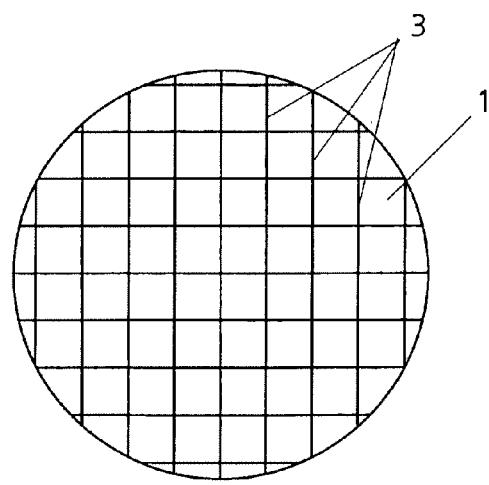
FIG. 6 shows the arrangement of conductor tracks in a matrix structure.

FIG. 6 shows an optical element 1 in which the conductor tracks 3 are arranged in the manner of a matrix. This variant of the disclosure, by virtue of in each case separate contact-connection of the conductor tracks 3, affords the possibility of heating along individual conductor tracks 3; this possibility is attractive in particular for compensating for astigmatism aberrations. In this case, the concentration of the heating power is increased locally in the regions of the crossover points of two conductor tracks 3 since approximately double the heating power is available in this region in comparison with the surroundings of the individual conductor tracks. The arrangement of the conductor tracks that is shown in FIG. 6 furthermore opens up the possibility of compensating for strip-type variations in the constitution of the material used for the optical element such as can occur at individual manufacturers.

Figure 7:
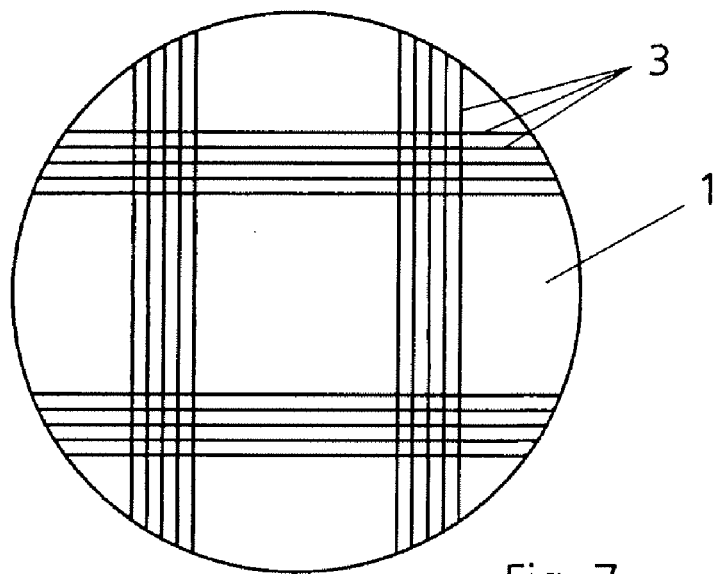
FIG. 7 shows a matrix structure with non-equidistant conductor tracks.

FIG. 7 shows the case where the conductor tracks 3 are not arranged equidistantly in the matrix structure across the optical element 1. This exemplary embodiment of the disclosure is suitable particularly for compensating for the effects of quadrupole illumination settings in the case where the optical element 1 is used in a projection exposure apparatus for semiconductor lithography.

Figure 8:
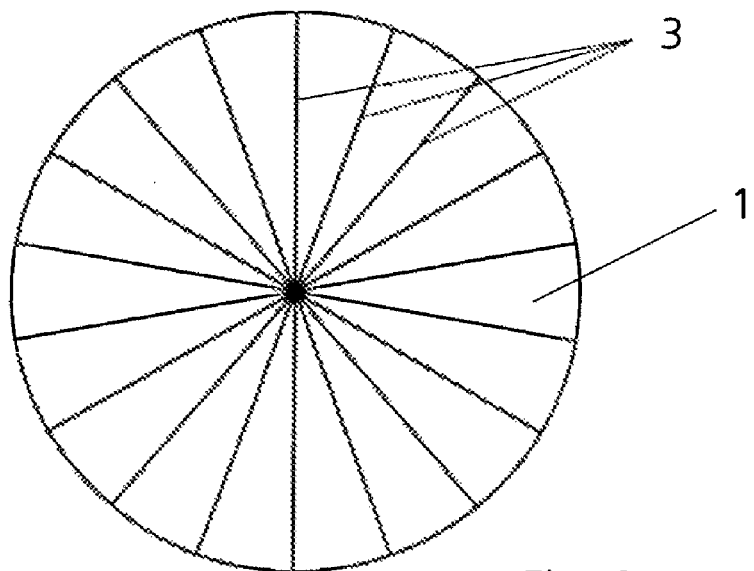
FIG. 8 shows a star-shaped arrangement of the conductor tracks.
Figure 9A:
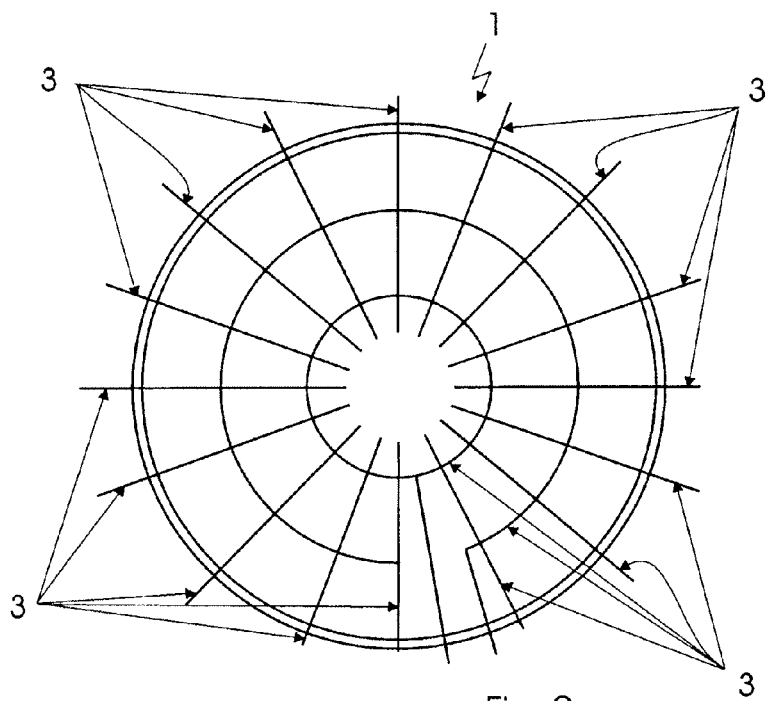
FIG. 9 shows, in subfigures 9*a* and 9*b*, rotationally symmetrical arrangements of the conductor tracks.
Figure 9B:
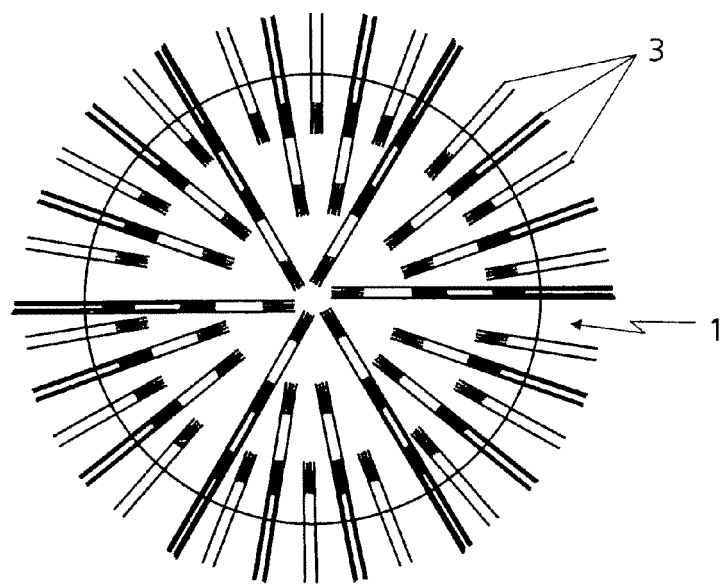

In order to minimize the light diffracted at the conductor tracks or the thermal actuators and the desired power supply, it is expedient to minimize the length of the feeder wires. For a uniform driving of correction elements over the area, preceding from an almost round optically utilized region such as is typical of areas near the pupil, a radial approach is conceivable. In this case, it may be provided that the arrangement of the conductor tracks or the thermal actuators has an at least approximate rotational symmetry about the optical axis, where the order of symmetry is 2 (rotation through 360°/order of symmetry transforms the arrangement into itself) or higher; FIG. 8 shows such a possibility that is suitable in particular for compensating for multiple ripple. In this case, the conductor tracks 3 are arranged in star-shaped fashion in the optical element 1; a variant in which the conductor tracks 3 are realized as a rotationally symmetrical grating is illustrated in FIG. 9a; a further rotationally symmetrical variant is shown in FIG. 9b.

Figure 10:
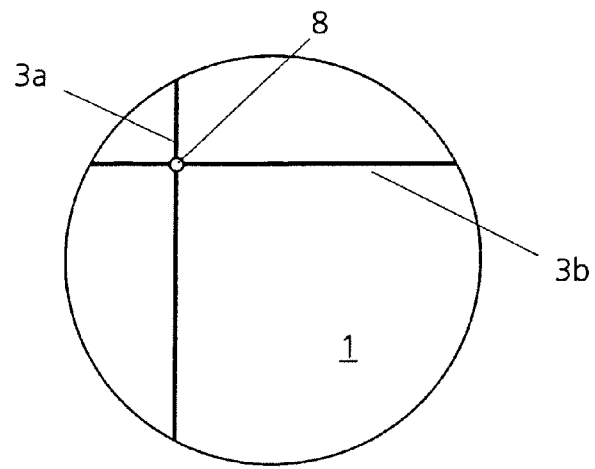
FIG. 10 shows a variant of the disclosure in which the conductor tracks are connected at their crossover points via resistors.

FIG. 10 shows a further modification of the disclosure. In this case, the conductor tracks 3a and 3b are connected at their crossover point via a resistor 8. If a voltage pulse is then applied simultaneously to the conductor tracks 3a and 3b depicted, the resistor 8 at the crossover point of the conductor tracks 3a and 3b is heated selectively. In this case, the heating along the conductor tracks 3a and 3b can be kept low by virtue of their resistance being kept low relative to that of the resistor 8. There is the possibility of arranging the conductor tracks 3 in an equidistant or non-equidistant manner. For the case where the conductor tracks 3a and 3b are contact-connected separately, the possibility is afforded of separately applying voltage pulses to the conductor tracks 3a and 3b. In this way, it is possible to a certain degree to set the heating power in the resistor 8 and along the conductor track 3a and 3b per se. This affords the possibility of correcting point aberrations via the resistor 8 and linearly extended aberrations using the conductor track 3a and 3b. The two conductor tracks 3a and 3b are illustrated merely by way of example in FIG. 10; it goes without saying that a multiplicity of conductor tracks 3 have to be arranged on the optical element 1 in order to efficiently distribute heating power over the optical element.

Figure 11:
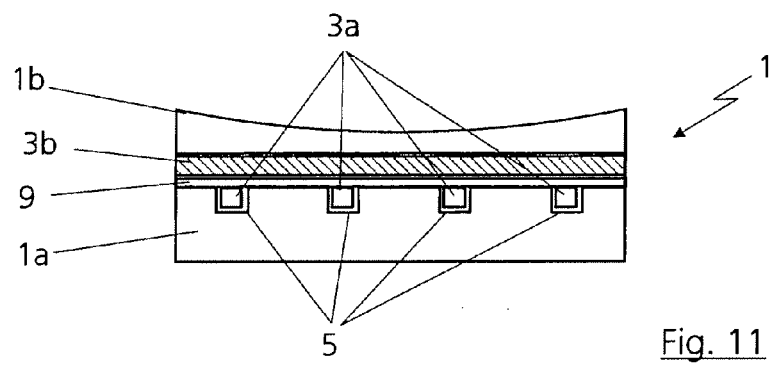
FIG. 11 shows a modification of the exemplary embodiment illustrated in FIG. 10.

FIG. 11 shows a variant in which the exemplary embodiment illustrated in FIG. 10 is combined with the concepts of FIG. 2. In this case, one set of conductor tracks 3a is arranged in the substrate 1a in a manner buried in cutouts 5. The other set of conductor tracks 3b is arranged on a surface of the second substrate 1b. By etching the surface of at least one of the two sets of conductor tracks 3 and subsequently applying a resistive layer 9 or by spot welding it is ensured that the contact region at the crossover point of the conductor tracks 3a and 3b has a higher resistance than the conductor tracks 3a and 3b themselves. In the illustration chosen in FIG. 10, the upper set of conductor tracks 3b is likewise arranged in buried fashion in the second substrate 1b parallel to the plane of the drawing, such that cementing of the two substrates can be dispensed with. An alternative to this consists in providing a cement layer (not illustrated); in this case, the burying of the conductor tracks 3a and 3b in their respective substrates 1a and 1b can be dispensed with.

Figure 12:
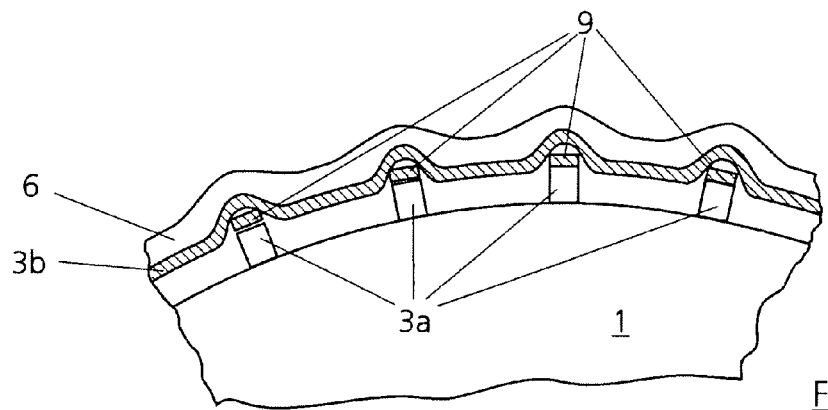
FIG. 12 shows a further modification of the exemplary embodiment shown in FIG. 10.

FIG. 12 shows a variant of the disclosure in which the procedure illustrated in FIG. 10 is employed on the surface of an optical element 1. In this case, the conductor tracks 3a are arranged on the surface of the optical element 1 itself, and are covered by the resistive layer 9 in the region of the crossover points with the second set of conductor tracks 3b running above. The arrangement is covered by the optical layer 6 as antireflection layer.

One alternative consists in connecting the two conductor tracks 3a and 3b via a further conductor track having a smaller cross section. For this purpose, the procedure as illustrated in FIGS. 11 and 12 are desirably adopted with the difference that an insulating layer is involved instead of the resistive layer 9. In this case, the further conductor track can be produced by the insulating layer being perforated locally by spot welding, laser welding or spark flashover, whereby at the crossover points a region between the conductor tracks 3a and 3b is produced which has a finite yet significantly higher resistance than the track resistance of the conductor tracks.

Figure 13:
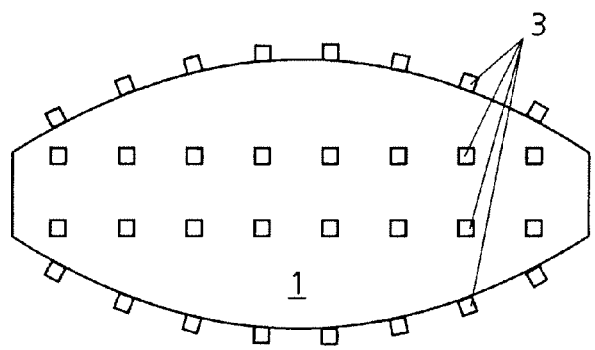
FIG. 13 shows one possibility for arranging conductor tracks on both sides of the optical element.

FIG. 13 shows an optical element 1 in which conductor tracks 3 are arranged on both sides and in the inner region. In this case, the conductor tracks 3 can be formed such that they are flat or adapted to the incident wavefront. This affords the possibility, for example by heating, of three-dimensionally influencing the density of the material of the optical element 1 and hence the refractive index. This enables the correction of homogeneity or voltage aberrations even in the case of optical elements 1 through which radiation is transmitted at large angles.

Figure 14:
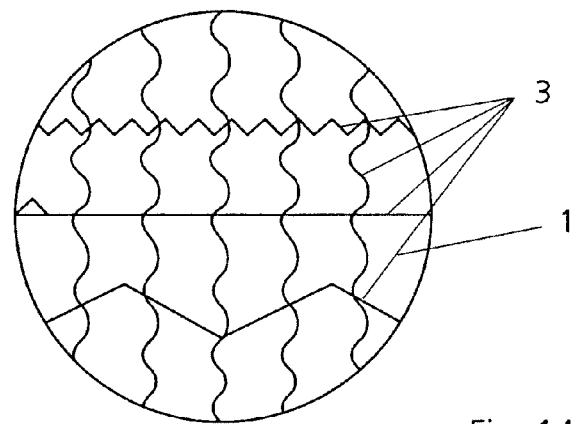
FIG. 14 shows various possibilities for cancelling the regulatory of the matrix structure.

FIG. 14 illustrates various variants as to how the matrix structure of the conductor tracks 3 can be configured in locally variable fashion, whereby the optical action of the conductor tracks 3 is distributed over a larger angle space. Thus, for example the density of the conductor tracks 3 can be varied or else it is possible to vary a differing degree of coiling of the conductor tracks 3 in terms of frequency and amplitude in order to optimize the local heating power density. In this case, the form of the coiling of the conductor tracks 3 can be chosen for example in sinusoidal fashion or else along sawtooth, triangular or other functions. It goes without saying that there is also the possibility of varying the profile of the conductor tracks 3.

Figure 15:
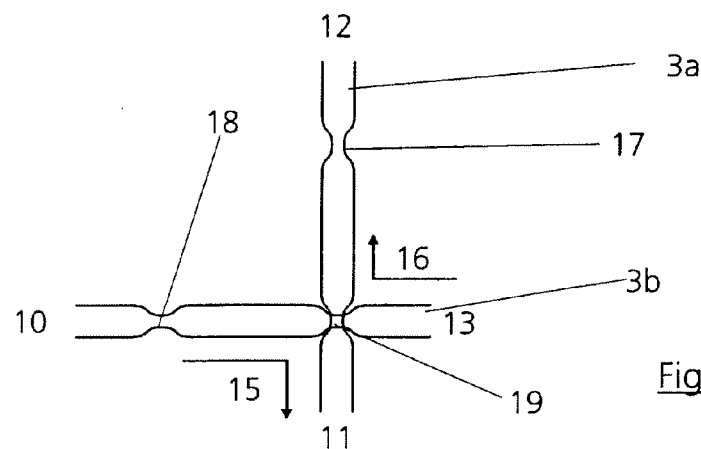
FIG. 15 shows a variant of the disclosure in which a resistive or insulating layer is superfluous.

FIG. 15 shows a variant in which a resistive or insulating layer can be dispensed with. In this case, the conductor tracks 3a and 3b are formed with a reduced cross section in the vicinity of their crossover points. The crossover point itself is realized in conducting fashion; this can be realized by vapour deposition one above another or spot welding. As an alternative, the desired structure can be produced by a metallization layer being applied, e.g. by vapour deposition, in areal fashion, from which layer the structure is subsequently produced e.g. via an etching process. A conductor track having an identical thickness in the entire region of the optical element 1 can be applied in a particular simple manner, only the width of the conductor track being varied. A disadvantage of this variant is that the tapered portions 17 and 18 of the current-carrying conductor tracks 3a and 3b, respectively, heat up to an identical extent. A selectivity can be achieved by a procedure in which a voltage is not applied simultaneously in each case to the conductor tracks 3a and 3b, but in each case only one end of the conductor tracks 3a and 3b. In other words, a voltage is applied between the points 10 and 11 in a first pulse and a voltage is applied between the points 12 and 13 in a second pulse. A current flows in the direction indicated by the arrow 15 during the first pulse, and in the direction of the arrow 16 during the second pulse. As a result of this measure, twice the power as at the tapered portions 17 and 18 is liberated at the crossover point 19 on average over time.

An explanation will be given below, with reference to FIG. 16, of one possibility for realizing a 2-dimensional array of individually drivable heating zones 101 which satisfies the very stringent desired properties for the maximum area coverage, that is to say of that proportion of the surface of the optical element 1 which is covered by the conductor tracks 3, the homogeneity of the area coverage, the homogeneity of the temperature distribution and the mutual crosstalk, that is to say the liberation of undesired heating power in a non-driven heating zone 101.

For a regular grating-type structure of the conductor tracks 3 for example in the pupil plane of a projection objective, the resulting scattered light component in the array is to a first approximation proportional to the area coverage. Typical scattered light levels of modern objectives of significantly less than 1% permit only a maximum area coverage of a few thousandths. Furthermore, the area coverage is desirably as homogeneous as possible. Figuratively speaking, the area coverage by the conductor tracks 3 is scanned by the light distribution in the pupil. Depending on the illumination setting and the structures to be imaged, the light intensities in the pupil plane are focused differently and to a relatively great extent especially in the case of dipole illumination settings. In order that the area coverage uniformly affects all diffraction orders, the area coverage averaged over the typical size of a dipole spot is desirably homogeneous within a few percent over the entire optically free region, that is to say over the entire region through which the optical useful radiation passes. Since the conductor tracks 3 cause a local heat input into the material of the optical element 1, which is not illustrated in FIG. 16, a so-called temperature ripple, that is to say a variation of the local temperature, forms at the surface of the optical element. In this case, the penetration depth of the temperature ripple into the optical element 1 corresponds approximately to the spacing of the conductor tracks 3. In order that the influence of the temperature ripple on the optical wavefront is kept small, the spacing of the conductor tracks is therefore desirably chosen to be dense enough. An arrangement of the conductor tracks 3 that is as regular as possible is advantageous for the same reason.

Figure 16:
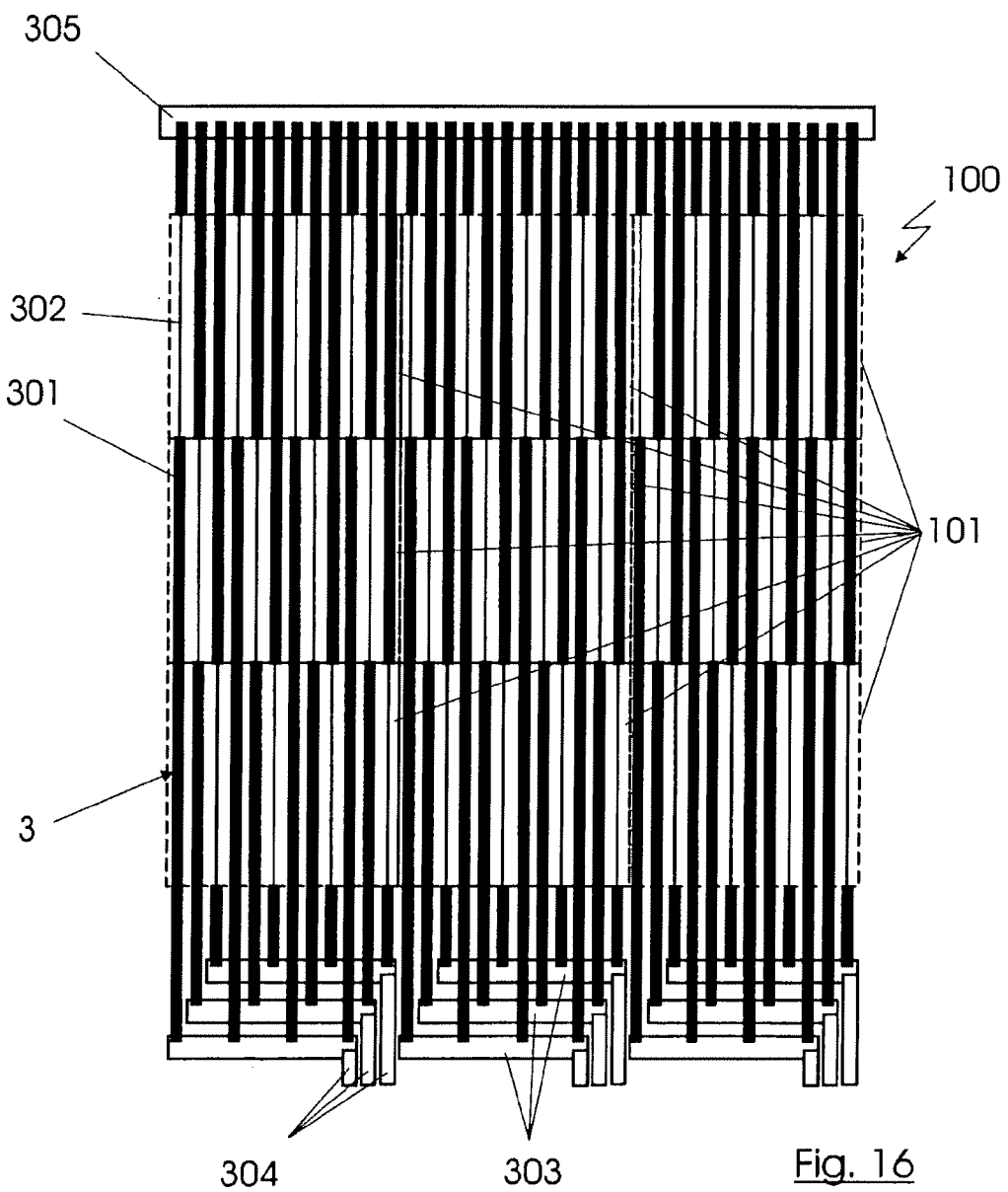
FIG. 16 shows a possibility for the spatially highly resolved thermal driving of different surface regions of an optical element.

The problem outlined is solved according to the disclosure, as illustrated in FIG. 16 by way of example on the basis of a heating array 100 composing 3×3 heating zones 101, by forming the conductor tracks 3 as an alternate arrangement of sections of feeder wires 301 and heating wires 302. In this case, the feeder wires 301 are chosen to have low impedance so as to cause a least possible heat input into the non-driven heating zones 101 traversed. The heating wires 302, by contrast, are chosen to have high impedance via a cross-sectional reduction e.g. as illustrated in FIG. 16, in order to generate the desired heat power locally in the assigned heating zone 101 and introduce it into the optical element 1, which is not illustrated in FIG. 16. The individual partial sections of the conductor tracks 3 that are formed in sections as feeder wires 301 and heating wires 302 as illustrated are here electrically contact-connected jointly via a bridge 303 in each case for a heating zone 101, which bridge, for its part, can be connected via a connecting pad 304 to a voltage source (not illustrated). On the opposite side, the contact-connection of the conductor tracks 3 is effected via the common busbar 305, which can be used jointly for all the conductor tracks 3.

It is advantageous to choose the ratio of the resistance of the feeder wire 301 to the resistance of the heating wire 302 to be as small as possible in order to minimize the crosstalk in those regions traversed by the feeder wires 301. What is advantageous about this heating wire concept is that the crosstalk, which cannot be completely eliminated on account of the cross-sectional limitations of the feeder wires 301, is limited to the heating zones 101 lying one behind another in the direction of the conductor tracks 3, a so-called column, and is homogeneous within the heating zones 101. It is thereby possible to decouple the parasitic heating power component on the driving side via a simple decoupling transformation; in other words, the closed-loop control, on account of the knowledge of the driving of the desired heating zones 101, can compensate for the parasitic effects in the heating zones 101 of the same column (the crosstalk).

In this case, the maximum parasitic heating power component within a heating zone 101 should not be greater than 10%-20% of the desired heating power. Designs having higher parasitic heating power values and hence an associated higher crosstalk are likewise conceivable. However, the desired properties for the accuracy of the decoupling transformation become more and more stringent as crosstalk increases, which involves an increased calibration outlay. Furthermore, the additional power range involved for the decoupling transformation also increases greatly.

The parasitic heating power component is proportional to the number of heating zones 101 within a column minus one and the feeder resistance and the heating resistance along a zone. For a heating array including 10 heating zones 101 per column and a sought crosstalk of 10%, this results in a desired resistance ratio of $R_{feed}$ (resistance of the feeder wire 301)/ $R_{hear}$ (resistance of the heating wire 302)=1/90, and in the case of a heating array including 15 heating zones 101 per column this results in an $R_{feed}/R_{heat}$=1/140. The resistance of feeder wires 301 and heating wires 302 can be set by way of the line width, the layer thickness, the material choice and by way of the effective line length.

For a predetermined resistance ratio of feeder wire 301 and heating wire 302, the value of the absolute resistances is upwardly limited by the desired voltage in order to realize a predetermined heating power. It is advantageous to strive for a maximum operating voltage of less than or equal to 200 V since the electronic and connection components can still be realized compactly in this voltage range. Although higher operating voltages are conceivable, they involve an increasingly higher outlay in order to avoid electrical flashovers and to ensure the dielectric strength of the electronic components.

The minimum possible feeder resistance is downwardly limited by the maximum permitted wire cross section, which is in turn limited by the permitted area coverage, and also by the resistivities of suitable conductive materials. In this case, pure elements have the lowest possible resistivities; the resistivities of alloys are generally higher than those of the elements. For a predetermined length of the heating zones 101 and a predetermined cross-sectional limitation, the minimum possible resistance is limited by the resisitivities of available conductive materials and hence also constitutes a physical limit.

On account of the explanations above, it is advantageous, in the design of the heating wires 302, to start with feeder wires 301 and to strive for a lowest possible feeder resistance for them within the limits of the permitted cross sections and available conductor materials. In order to obtain the desired resistance ratio, the resistance of the heating wires 302 is then orientated towards the feeder resistances. For this purpose, it is possible to minimize the cross sections of the heating wires 302 relative to the cross sections of the feeder wires 301 within the limits of the process capability. It is thereby possible to realize for instance a cross-section ratio of 0.5-0.1. In order to achieve a resistance ratio of approximately two powers of ten, however, a cross-sectional reduction is generally not sufficient. It is advantageous, therefore, to use a second conductor material, the resistivity of which is greater than that of the feeder wires 301. Moreover, it may be advantageous to lengthen the effective length of the heating wire 302 via a meandering configuration and thereby to increase the total resistance of the heating wire 302. The heating wire resistances can theoretically be increased arbitrarily by way of the effective length, but this is detrimental to the area coverage, for which reason length factors of between 1-50 can be used.

Figure 17:
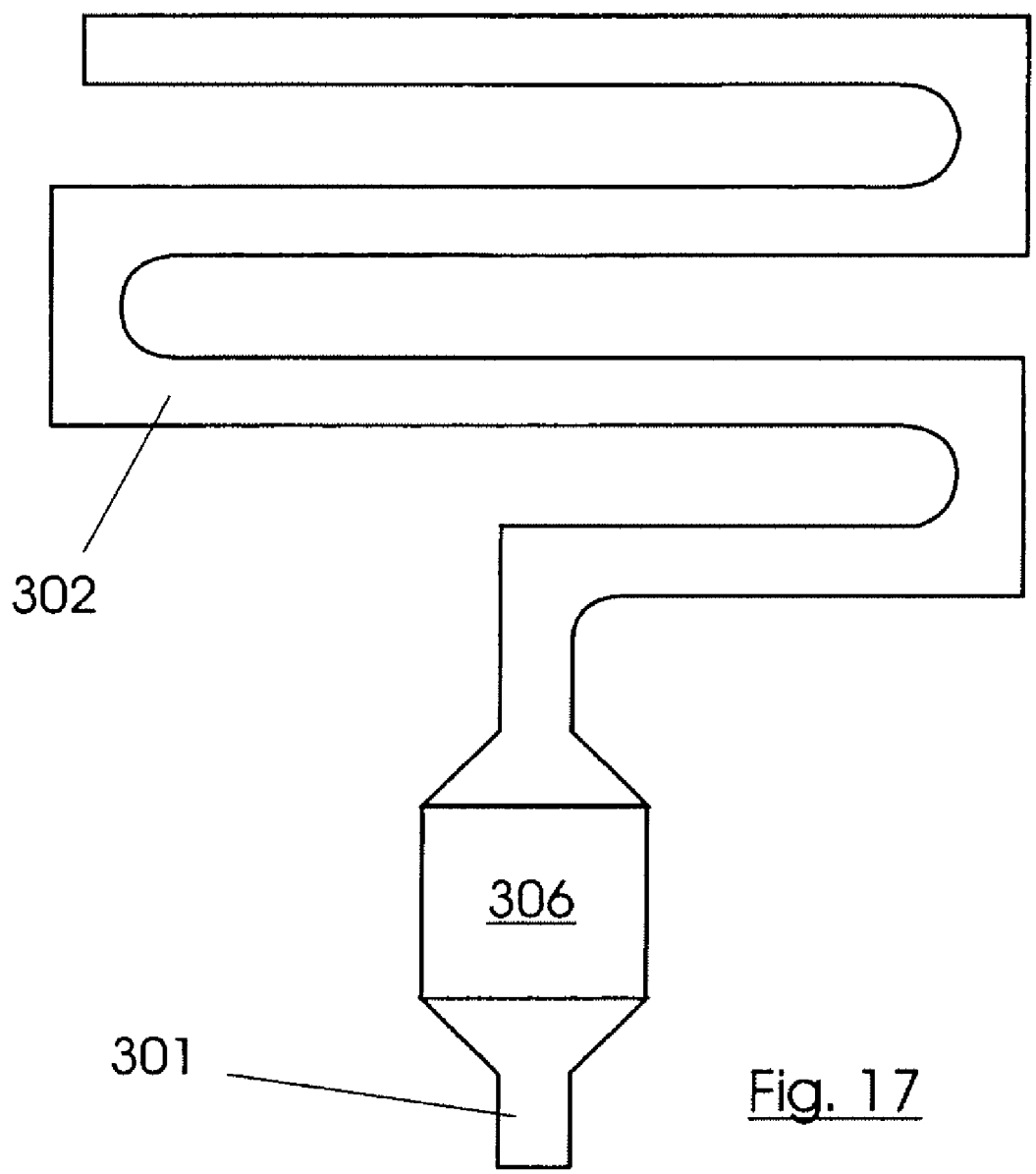
FIG. 17 shows an exemplary embodiment of the feeder wire, of a meandering heating wire and of a transition region.

An advantageous exemplary embodiment of the feeder wire 301, of a meandering heating wire 302 and of the transition region 306 between the individual sections is shown in FIG. 17. In order to avoid high current densities at the inner corners of the heating wire 302, the latter is rounded by radii. As an alternative, bevels can also be provided. Furthermore, it may be advantageous to provide a transition zone having a larger overlap region in the transition region 306 of the two materials in order to reduce the current densities in this region and thus to eliminate the risk of electromechanical degradation at the boundary layer. Furthermore, an enlarged overlap region may be advantageous in order to elevate the desired overlay properties if feeder wires 301 and heating wires 302 are patterned in two separate lithographic processes.

Since, in the case of the heating wires 302, depending on the desired outcome, very thin lines having the smallest possible layer thicknesses are sought in order to set the electrical resistance to the desired level, there is here an increased risk of defects as a result of constrictions, material thinning, layer defects, resist defects, particles and stitching defects. It is advantageous, therefore, to arrange the heating wires 302 in such a way that the latter are robust with respect to local defects.

Figure 18:
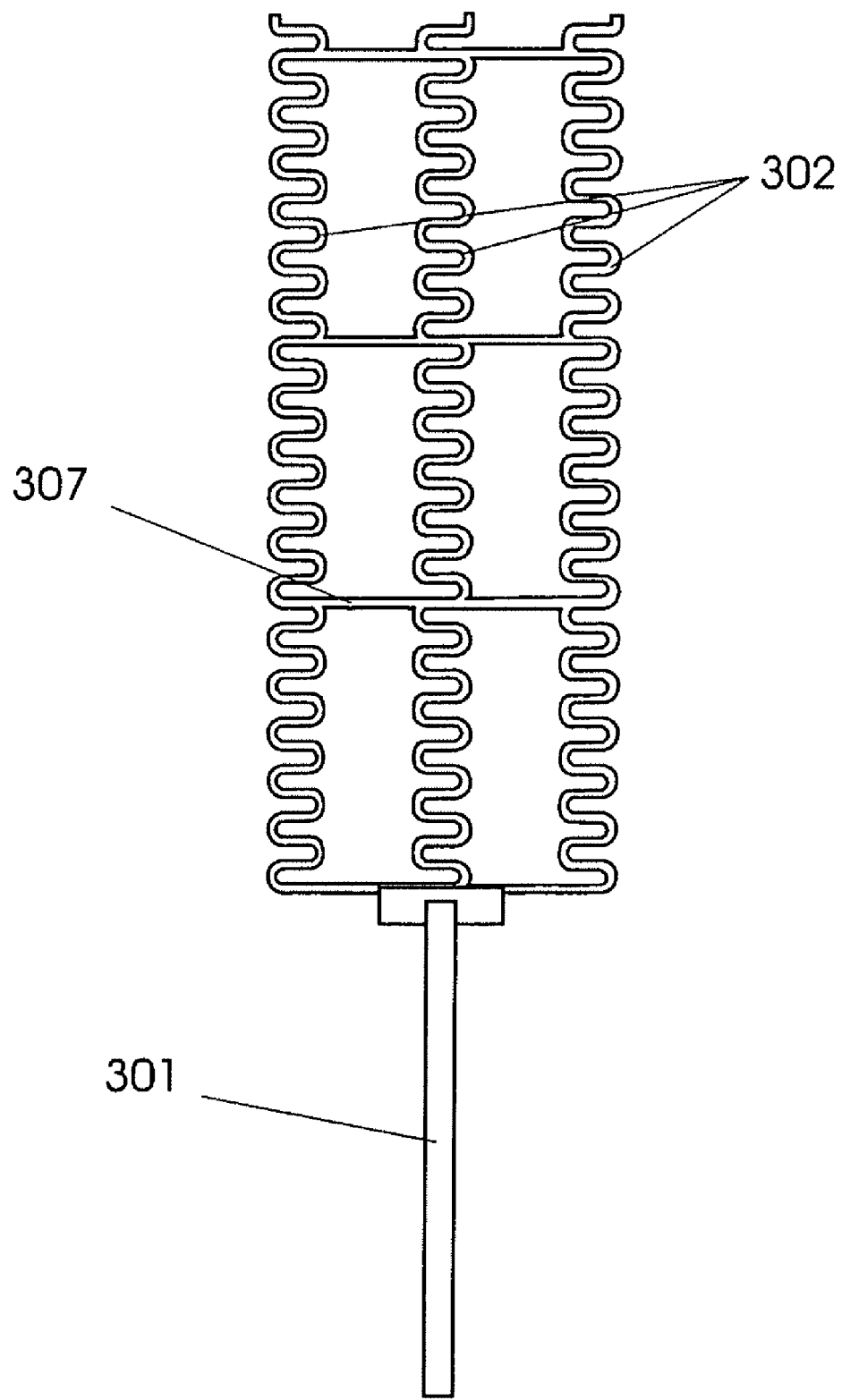
FIG. 18 shows one possibility for arranging the heating wires in such a way that the latter are robust with respect to local defects.

The basic idea in this regard is shown in FIG. 18. Instead of an individual meander, now a plurality of meandering sections of the heating wire 302 are arranged parallel and connected transversely at regular spacings with bypasses 307. If a local defect occurs in one of the sections, then the current passes around this location via the bypasses 307 and the adjacent meandering sections.

Metals having a low resistivity such as Ag, Cu, Au, Al, Wo, Mo, Sn or Ni are optionally chosen as materials for the feeder wires 301.

Metals having a relatively high resistivity such as Ni, Pt or Cr or semiconductors such as Si or Ge are optionally chosen as materials for the heating wires 302. In this case, it may be advantageous to optimally adapt the resistivities of the materials used by doping with impurity elements for the desired properties. In the case of metals, the resistivity can be artificially increased by doping or by introduction of alloying constituents; in the case of semiconductors, the resistivity can be artificially reduced by introduction of doping elements.

Depending on the number of heating zones 101 per optical element 1 and the number of heating wires 302 per heating zone 101, a few hundred up to a few thousand wires have to be electrically contact-connected. In order to keep the connection complexity of the heating zones 101 as low as possible, it is therefore advantageous for wires already to be combined on the optical element 1. As shown in FIG. 16, on one side of the heating array 100 it is possible to combine all the feeder wires at a common busbar 305. On the opposite side, all the conductor tracks 3 which are assigned to the same heating zone 101 can be combined via bridges 303. This reduces the number of connecting lines to the number of actively driven heating zones 101.

Figure 19:
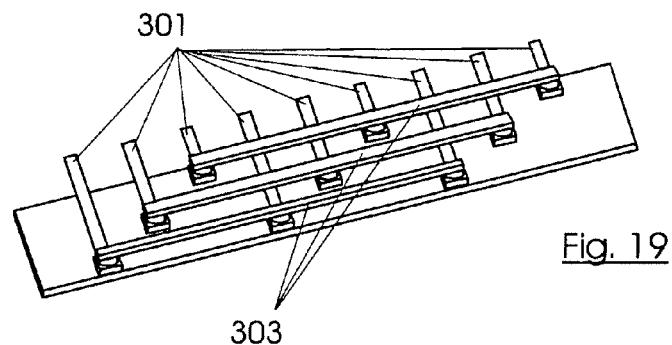
FIG. 19 shows a basic illustration of the contact-connection of the conductor tracks.

In some embodiments, the bridges 303 are realized with the aid of a second level with conductor structures, which is electrically insulated from the first level with the conductor tracks 3 via a suitable dielectric. Via contact-connecting holes (so-called interconnects), all the feeder wires 301 associated with a heating zone 101 are connected to the bridge 303. The electrical connection towards the driver electronics can then be performed via a contact area on the second level or an uncovered contact area on the first level; a basic illustration of this solution is shown in FIG. 19.

In an alternative exemplary embodiment, the bridges 303 are realized by bonding wires, whereby the patterning of a second level can be obviated.

In a further alternative exemplary embodiment, the bridges 303 are realized in the connection board. In this case, although the number of contact-connecting points corresponds to the number of conductor tracks 3, the number of lines led out is reduced to the number of heating zones 101.

Despite the reduction of the lines via the measures outlined above, the number of lines led out of typically hundred to several thousand is problematic since introduced forces and moments can cause deformation, tilting and changes in position of the optical element 1 which in turn gives rise to optical aberrations. Therefore, it is desirable to electrically link a multiplicity of connecting lines to the optical element 1 according to the disclosure as far as possible in a manner free of forces.

In a first exemplary embodiment, the electrical connection is realized via wire bonding onto a transfer board, the transfer board being mechanically decoupled from the optical element 101. Since the bonding wires can be chosen to be very thin and the arcuate geometry is favourable with regard to minimizing the mechanical stiffness, bonding bridges constitute electrical connections having minimal mechanical stiffness and hence optimal mechanical decoupling.

Figure 20:
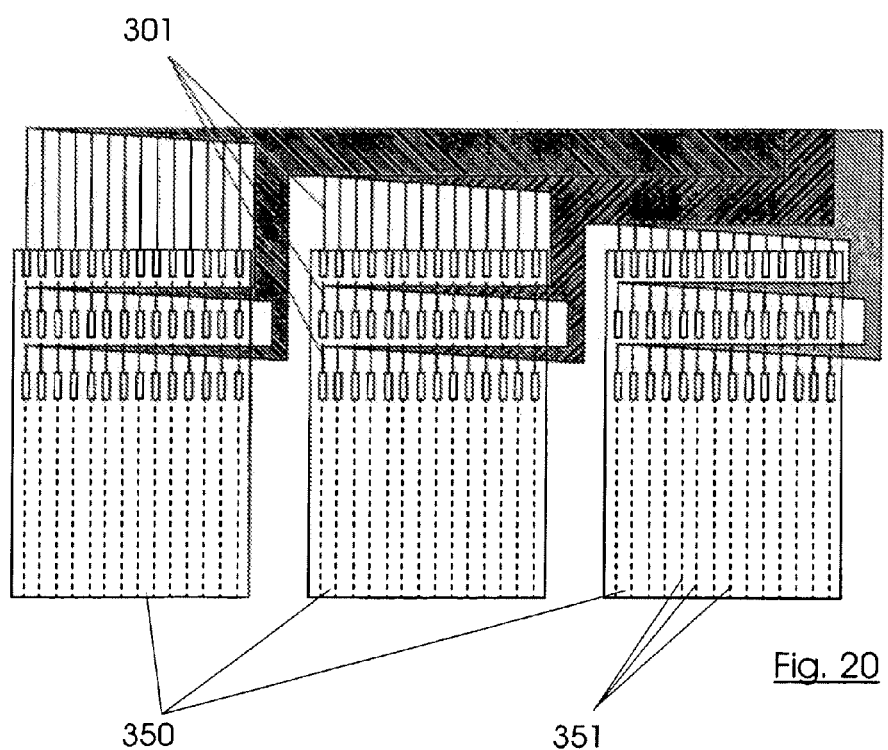
FIG. 20 shows the use of flexible conductor films for electrical linking.

As an alternative, flexible conductor films 350 can also be used for electrical linking, as shown in FIG. 20. In an advantageous manner, in this case all the feeder wires 301 assigned to a heating zone 101 can be arranged one behind another in alignment on the same contact-connecting track 351 on the flexible conductor film, whereby the contact-connecting complexity is reduced. Furthermore, it is advantageous to arrange the contact-connecting tracks associated with the same column on the same conductor film 350. In order to reduce the area stiffness of the flexible conductor films 350, an S form or a plurality of undulations similar to a bellows can be impressed. Furthermore, it is advantageous for the flexible conductor film 350 to be slotted in sections along the contact-connecting series in order to prevent shear stresses, which can result in a deformation of the optical element, from being built up by way of the area stiffness of the flexible conductor film 350. Suitable methods for electrically contact-connecting the flexible conductor film 350 to the contact points of the optical elements according to the disclosure are electrically conductive adhesive, aniosotropically conductive adhesive or adhesive tapes, anisotropically conductive tapes, soldering connections via stamp soldering, furnace soldering, hot air soldering or laser soldering, and also wire bonding.

In order to avoid creepage currents and flashovers, it is advantageous to embed the conductor tracks on the optical element into an $SiO_2$ layer or layer of some other optically transparent dielectric. Such a layer is also advantageous because it covers possible surface defects and roughnesses caused by the patterning process and can be overpolished in order to achieve the desired fitting tolerances.

The scattering light component caused by the conductor tracks in the wafer plane of a projection exposure apparatus may also be dependent, besides the area coverage, on the orientation of the conductor tracks relative to the scanning direction. A field diaphragm in a field position downstream of the optical element according to the disclosure can absorb a considerable portion of the scattered light caused by the conductor tracks, such that the scattered light is not incident on the wafer to be exposed. In this case, a favourable form of the field diaphragm corresponds to the image of the scanner field. Since the scanner slot is significantly narrower in the scanning direction than perpendicular thereto, it is advantageous to arrange the wires perpendicular to the scanning direction, such that the scattered light is diffracted in the scanning direction, in which case, by virtue of the field aperture that is narrower in this direction, a significantly greater portion is absorbed than perpendicular thereto.

Figure 21:
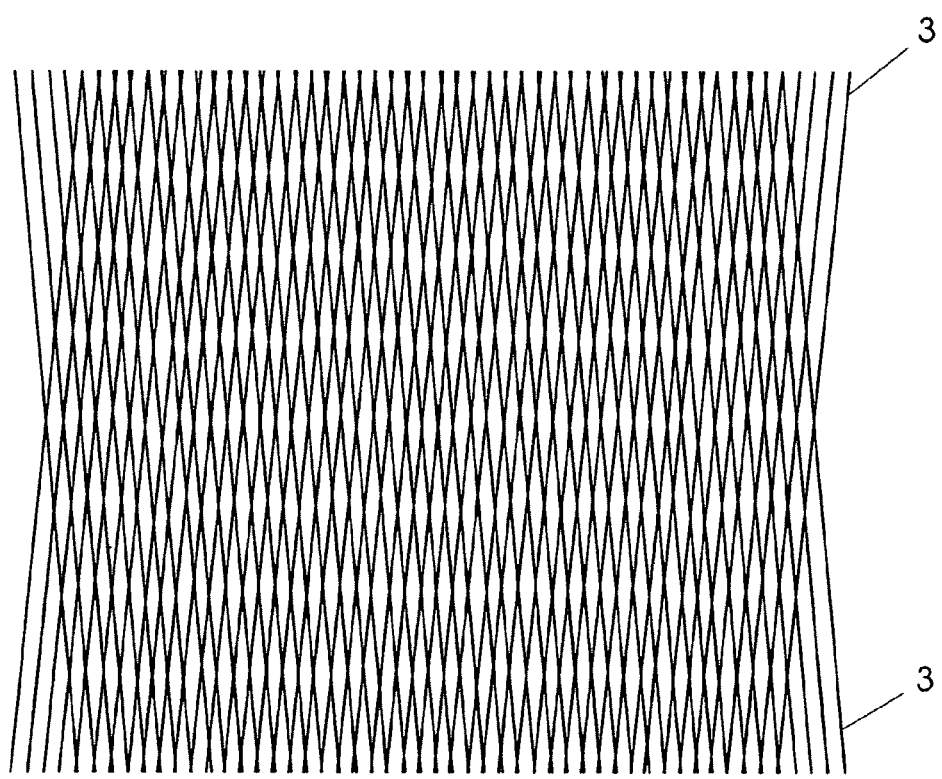
FIG. 21 shows one possibility, in the case of two plate-type optical elements according to the disclosure which lie one above another, for avoiding Moire effects and at the same time profiting from the desired direction with regard to scattered light.

In order avoid Moire effects in the case of two plate-type optical elements according to the disclosure that lie one above another, it may be advantageous to arrange the optical elements such that they are rotated by 90° with respect to one another. The area coverage at each point thereby becomes independent of the angle of incidence. In order, however, simultaneously to profit from the desired direction with regard to scattered light, in one exemplary embodiment a rotational angle of just a few angular degrees is chosen, as shown in FIG. 21. These small angles suffice first to ensure that the Moire effects average out over the extent of the smallest possible light intensity spots (sine effect), and at the same time the desired direction with regard to scattered light suppression remains virtually unaffected by this (cosine effect).

Figure 22:
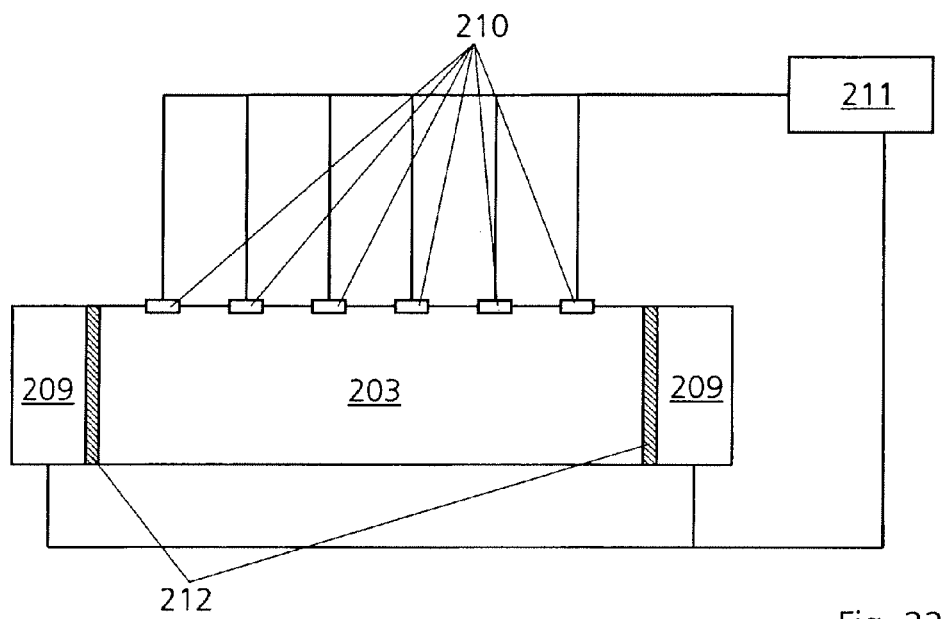
FIG. 22 shows a further schematic illustration of an optical element according to the disclosure.

FIG. 22 shows, as a further exemplary embodiment of the disclosure, the optical element 203 formed as a lens provided with heating elements 210 at one of its surfaces. The heating elements 210 are driven by the open-loop or closed-loop control 211; the open-loop or closed-loop control 211 furthermore drives the heat sink 209, which, as a ring-shaped element, encloses the optical element 203 formed as a lens. For mechanical decoupling or avoiding the transmission of vibrations from the heat sink 209 into the optical element 203, the elastic mass 212 is arranged between the heat sink 209 and the optical element 203, the elastic mass on the one hand exhibiting a good thermal conductivity, but on the other hand ensuring, on account of its elasticity, a sufficient mechanical decoupling of the heat sink 209 from the optical element 203. As an alternative, a thermally conductive paste, liquid or a gas can also be situated in the gap between the optical element 203 and the heat sink 209.

FIG. 23 shows, in a variant of the disclosure, the alternative optical element 208 formed from the first partial element 201 and from the second partial element 202. In the present example, the two partial elements 201 and 202 are embodied as plane-parallel plates with a diameter of approximately 160 mm and a total thickness of approximately 20 mm. In this case, the first partial element 201 is composed of fused silica and the second partial element 202 is composed of $CaF_2$. In this case, the thicknesses of the two partial elements 201 and 202 are related to one another approximately like the temperature dependencies of the refractive indices of fused silica and $CaF_2$. Assuming that fused silica exhibits an in terms of magnitude 6.7-fold higher dependence of the refractive index on the temperature than $CaF_2$, approximately 2.6 mm result for the thickness of the first partial element 201 composed of fused silica, while approximately 17.4 mm result for the thickness of the second partial element 202 composed of $CaF_2$. In the example shown, which is intended to be applicable below as the basis for a model calculation, an individual heating element 205 is arranged on the free surface of the first partial element 201, the heating element being formed in rotationally symmetrical fashion with a diameter of 10 mm. It goes without saying that in other exemplary embodiments of the disclosure a multiplicity of heating elements or generally thermal actuators, in particular also arranged in arrays, are conceivable. Furthermore, for wavelengths >193 nm, other combinations of optical materials are also conceivable which have a sufficient difference in terms of the thermal conductivity and in terms of the temperature sensitivity of the refractive index.

The heating element 205 locally impresses a heat flow that flows through the first partial element 201 in the axial direction in the direction of the second partial element 202 as indicated by the arrow 206. In this way, a great temperature increase arises locally in the first partial element 201 on account of the low thermal conductivity thereof. Since the second partial element 202 has a high thermal conductivity ($CaF_2$ exhibits a 7-fold higher thermal conductivity than quartz), it conducts away the input heat flow in the direction of the arrow 207 radially to the heat sink 204 at the edge of the optical element 208. In this case, the temperature increase that results in the partial element 202 is significantly smaller than that in the partial element 201.

The local temperature increase in the partial element 201 (lower thermal conductivity) leads to a local change in the refractive index there. This effect is also manifested in the second partial element 202, but it turns out to be considerably smaller on account of the partial element being heated to a significantly lesser extent and on account of the lower index change due to the temperature increase.

In the present model-type consideration, the heating element 205 formed for example as a resistance heating element heats the first partial element 201 in such a way that a heat flow from the heating element 205 into the first partial element 201 of approximately 500 W/qm can be assumed. This results in a power of approximately 40 mW for that on the area of the heating element 205; a heating of the entire free surface of the first partial element 201 would result in a power transmission of approximately 10 W. It is assumed below that the heating element 205 is arranged centrally in the free surface of the partial element 201. For the heat sink 204 at the edge of the optical element 208 it is assumed that it is kept at a constant temperature.

For the model-type consideration it can be assumed that the heat flow in the first partial direction 201 proceeds exclusively in the axial direction, that is to say in the direction of the second partial element 202. This constitutes a good approximation because, on the one hand, the first partial element 201 is considerably thinner than the second partial element 202 and, on the other hand, the thermal conductivity of the first partial element 201 is significantly lower than the thermal conductivity of the second partial element 202. Analogous considerations mean that an exclusively radial heat flow in the direction of the heat sink 204 can be assumed in the second partial element 202. Furthermore, it is assumed for the model-type consideration that both partial elements 201 and 202 exhibit the same radial temperature distribution from the outer edge of the heat source 205 as far as the outer edge of the partial element 201 and 202, respectively.

FIG. 24 shows the local axial temperature distribution in the first partial element 201; FIG. 25 shows the radial temperature distribution in both partial elements 201 and 202. As expected, it can clearly be discerned from the illustration that the axial temperature gradient in the first partial element is significantly higher than the radial temperature gradient.

FIG. 26 shows the effect of the heat that is input by the heating element 205 and dissipated by the heat sink 204. The optical path length relative to the unheated edge of the partial element 201 increases locally in the region of the heating element 205 by approximately 24 nm; this effect depends quadratically on the thickness of the first partial element 201.

FIG. 27 shows the relationships in the two partial elements 201 and 202 outside the heating zone. It can clearly be discerned that on account of the material choice in conjunction with the dimensioning of the partial elements 201 and 202, the effect achieved is that the changes in the optical path length precisely compensate for one another outside the region of the heating element 205.

FIG. 28 illustrates the overall effect of the arrangement including in the region of the heating element 205. On account of the higher temperature of the first partial element 201 in the region of the heating element 205, the effect that arises in the region of the heating element 205 is that a change in the optical path length of approximately 24 nm is established as a result. Outside the heated region, the opposing effects almost completely cancel one another out. What is thus achieved is that optical path lengths in optical elements can be set locally in a very precise manner and without parasitic effects via the impressed heat powers.

FIG. 29 shows a consideration of the dynamic response of the temperature-regulating operation outlined above. The cancelling of the radial edge effects presupposes that a steady-state condition has been established and both partial elements have the same radial temperature profile. The heat will firstly propagate in the partial element having the higher thermal conductivity and only later reach the partial element having the lower thermal conductivity. Consequently, during the setting of the thermal equilibrium, the optical effects of the partial elements do not cancel one another out and transient radial edge effects arise maximally of the order of magnitude of the effects of an individual partial element. For this reason it is desirable to examine the time constants of the radial propagation of the temperature distribution. This is intended to show what times are involved for setting the desired—edge-effect-free—state. FIG. 29 shows the normalized step response of the temperature at the edge of the temperature-regulating zone. It is desirable to reckon with times of less than 2 min for a diameter of the partial elements of 80 mm and approximately 7 min for a diameter of 160 mm in order to attain 90% of the final value. If the neutral state of the manipulator is chosen such that a homogeneous average heating power density is present over the optical element, then this time constant occurs only during the starting of the manipulator. For setting the correction profiles, essentially the axial heating of the first partial element formed for example as a fused silica plate is then relevant, which has a significantly shorter setting time of approximately 8 s. This also has the advantage that preceding from the neutral state, by increasing or reducing the local heating powers, the optical thickness of the element can be varied locally in both directions. The time constants can be reduced in part by the model-based driving or a suitable pilot control of the heating zones in the edge region. The heating zones would heat the edge region of the fused silica plate in time- and location-dependent fashion in such a way that an equilibrium of the temperatures between, for example, fused silica and $CaF_2$ plates as partial elements is established more rapidly.

FIG. 30 shows an exemplary embodiment of the disclosure in which the first partial element 201 is formed as a plane-parallel plate composed of $SiO_2$ and the second partial element 202 is formed by a layer of liquid. Thermal manipulators 205 formed as resistive heating elements are arranged on the opposite side of the first partial element 201 to the interface between the first partial element 201 and the second partial element 202; FIG. 31 provides an overview of an exemplary distribution of the thermal manipulators 205 across the optical element 208.

With a flowing layer of an optically transparent liquid such as e.g. water, it is possible to realize a heat reservoir which fixes the interface at a reference temperature largely independently of the heat input by the heating elements on the opposite side. Via the heating elements, heat powers and hence the temperature profiles relative to the reference temperature can now be impressed into the first partial element 201. In this case, the amplitude of the impressed temperature profile and of the corresponding optical effect is proportional to the impressed heat power, for which reason the correction effect of such an optical element 208 can easily be controlled by the impressed heating current. Furthermore, the arrangement shown profits from the very short heat conducting paths of the essentially vertical temperature gradients, which enable fast response times, which is highly advantageous in terms of control engineering. Response times of a few seconds to approximately in the region of half a minute result for typical thicknesses of the first optical element 201 of 5-30 mm.

FIG. 32 illustrates, in a sectional illustration, a further possibility for changing the temperature profile of an optical element 203 by targeted local heating on one or both surfaces of the optical element 203 formed for example as a lens. The heating is effected by applying a voltage to a conductor arrangement 213 and 214 on the surface of the optical element 203. The underlying physical principle is the realization of resistance heating via the heat developed on account of the ohmic resistance in the conductor arrangements 213 and 214.

A conductor arrangement 214 with a suitable geometry is applied on an optical element 203. A further conductive material is applied thereon in a further conductive arrangement 213. A functional layer 215 having the function of resistance, electrical contact and/or mechanical adhesion can be arranged between the two conductor arrangements 213 and 214. By superimposing the two conductor arrangements 213 and 214, a pattern of contact locations 217 arises on the surface of the optical element 203. By applying a defined electrical voltage via the voltage source 216, heat can be generated locally in a supervised fashion via the resistance of the contact location 217. In this case, an addressing of the contact locations can be achieved in particular via a diode circuit in conjunction with a suitable time division multiplex technique. Given a suitable choice of the materials of the conductor arrangements 213 and 214 in particular in conjunction with the material of the functional layer 215 within the electrochemical series, a Peltier element can be realized at the contact locations 217 and heat can thus be generated or dissipated locally and in a supervised fashion. Conversely, the temperature at the contact locations 217 can be determined via a voltage measurement.

FIGS. 33 and 34 show different possibilities for arranging the conductor arrangements 213 and 214 on the optical element 203.

FIG. 35a shows, in a sectional illustration, an alternative design of a manipulator 400, which can be used for correcting in particular wavefront aberrations in projection objectives. In this case, the manipulator 400 includes the optical correction element 401, which is formed as a plane-parallel $SiO_2$ plate in the present example. It goes without saying that other forms of realization of the correction element 401 are also conceivable; the correction element 401 can in particular also be formed as a Zerodur mirror worked with high precision. Directly adjacent to the correction element 401 is the temperature-regulating medium 403, which in the present example is formed as a layer of water serving as heat or cold reservoir. The heat transport elements 402 are arranged at the interface between the correction element 401 and the temperature-regulating medium 403. Heat transport elements are to be understood hereinafter to mean all elements which can ensure a heat transport from the correction element 401 to the temperature-regulating medium 402, or vice versa, via a temperature gradient normally relative to the interface between the correction element 401 and the temperature-regulating medium 403. In the present example, the heat transport elements 402 are formed as Peltier elements; it goes without saying that other designs are also conceivable; it is also conceivable, in particular, to use passive elements as heat transport elements 402, which passive elements can have for example a considerably higher thermal conductivity than the correction element 401 and/or the temperature-regulating medium 403; it thereby becomes possible to set desired temperature distributions in the correction element 401 at least temporarily merely via a change in the temperature of the temperature-regulating medium 403. In order to ensure the function of the temperature-regulating medium 403, it is advantageous for the latter to flow past the correction element 401 in particular as a laminar flow. In the case where the heat transport elements 402 are formed as Peltier elements, it is possible for the correction element 401 both to be cooled and to be heated as desired depending on the polarity present, in a locally controlled manner. In this case, the temperature-regulating medium 403 flowing past is used to feed and dissipate heat efficiently.

FIG. 35b illustrates a plan view of the manipulator 400 according to the disclosure with an exemplary distribution of the heat transport elements 402.

The variant of the disclosure that is illustrated in FIG. 35 exhibits as particular advantages its high flexibility, in particular on account of the simple capability of changing over from cooling to heating operation. Furthermore, the dimensions of the heat transport elements 402 can be effectively limited, particularly in the case where they are formed as Peltier elements. Micro-Peltier elements exhibiting a size of 0.72 mm×1.47 mm×0.43 mm are already commercially available at the present time, in particular the small height of these components of just 428 µm being advantageous. Particularly in comparison with a mechanical solution using piezoelectric actuators, the small z extent (height of the Peltier elements) is advantageous precisely in the case of a suboptimally corrected pupil.

Furthermore, the use of Peltier elements as correction elements 401 permits, in principle, an auto-servo control of the temperature setting in accordance with the temperature-induced voltages in the Peltier element, that is to say the use of the Peltier elements sometimes as sensors and sometimes as thermal actuators. Correction of a projection objective equipped with the manipulator 400 according to the disclosure via a translation matrix that links the local temperature in the pupil element with the image aberrations of the overall system is also conceivable.

In the case where the Peltier elements are used in unidirectional fashion, that is to say only in heating operation or in cooling operation, more effective closed-loop control is possible on account of the better linearity of the Peltier elements in this operating mode.

FIG. 36 shows a variant of the manipulator 400 according to the disclosure that is further improved with respect to the solution presented in FIG. 35, likewise in a sectional illustration. The essential difference with respect to the concept illustrated in the previous figures consists in the realization of a gap 406 between the correction element 401 and the temperature-regulating medium 403, which is delimited by the first guide element 404 and the second guide element 405 in the present example. The heat transport elements 402, which can be realized as Peltier elements in this exemplary embodiment, too, are arranged in the gap 406 between the correction element 401 and the temperature-regulating medium 403. In this case, the gap 406, which can be for example evacuated or filled with a gas such as air, has the effect that a thermal decoupling between the correction elements 401 and the temperature-regulating medium 403 is ensured in the regions in which no heat transport elements 402 are arranged. The thermal decoupling has the effect that a so-called thermal short circuit and hence a reduction of the efficiency of the manipulator 400 according to the disclosure are effectively avoided. Since the guide elements 404 and 405 that guide and delimit the temperature-regulating medium 403 exhibit a close thermal coupling to the temperature-regulating medium 403, they have an essentially homogeneous temperature distribution, such that parasitic influences on the wavefront to be corrected are kept small by the guide elements 404 and 405. This can be reinforced in particular also by forming the heat transport elements 402 in such a way that they are led for example through suitably dimensioned openings in the first guide element 404 and are in thermal contact directly with the temperature-regulating medium 403, such that exposure of the first guide element 404 to the heat flow used for the temperature regulation of the correction 401 is minimized. If appropriate, even further precautions can be implemented for thermally insulating the heat transport elements 402 from the first guide element 404. Besides water, a multiplicity of other liquids or gases transparent to the radiation used in the projection objective are also suitable as the temperature-regulating medium 403; the simplest representatives are water and air, of course.

FIG. 37 shows a further exemplary arrangement 600 according to the disclosure, in which an optically transparent 2-dimensional array of controllable heat sources and heat sinks is realized by heat being drawn permanently via a cold gas flow 602 at the two optical elements 601 at an interface across the entire area that is to be thermally actuated. It goes without saying that the arrangement of just one or more than two optical elements is also conceivable; furthermore, the liquid flow can also be used instead of the gas flow 602. Gases which are optically transparent in the relevant wavelength range, such as pure air, N2 and He, which are suitable for all wavelengths of the refractive projection objectives, are advantageous as cooling gases.

In addition, arranged across the interface 603 are heating arrays—not designated in the figure—with heating zones with very fine wires, wherein the heating current of each individual heating zone can be set individually. In this case, the heating arrays or the heating zones can be realized and contact-connected in particular in the manner described with reference to FIGS. 1-21, in particular FIGS. 16-21. The net heat power density in a heating zone is consequently composed of the permanent heat loss due to the gas flow 602 and the controllable heat input by the heating wires formed for example as conductor tracks. Depending on the heating power set, this results in an exact compensation of the cooling power and thus a net heat power density of zero, an undercompensation of the cooling power and thus a negative heat power density or an overcompensation and thus a positive heat power density. The cooling power bias in combination with a controllable heating power density therefore makes it possible to realize arrays of heat pumps whose heat input per array is controllable in terms of magnitude and direction. In this case, the arrangement and dimensions of the conductor tracks or the heating wires are chosen such that a homogeneous area coverage in the region of a few thousandths results and the optical action of the conductor tracks or the heating wires is thus negligible.

In the exemplary embodiment illustrated in FIG. 37, the two optical elements 601 formed as plane-parallel plates are arranged one above another in such a way that the two planar inner sides form a flow channel 604 for the gas flow 602 of the cooling gas. The heating arrays are optionally applied on the optical elements 601 on the interfaces 603 facing the flow channel 604. What is thereby achieved is that the heating power of the heating elements directly counteracts the cooling power due to the cooling gas and the net heat input into the optical element 601 is set at the respective interface 603. In particular, in the neutral state, the heating power exactly compensates for the cooling power and the net heat flow through the interface 603 is therefore zero, whereby there is no reason for temperature gradients in the optical element 601 particularly given a sufficiently dense arrangement of the heating arrays.

As an alternative, it may be advantageous in terms of production engineering to fit the heating wires on the outer side on one or on both optical elements 601. In this case, the heat has to flow through the optical elements 601, which causes a temperature gradient through the optical elements. In the neutral state, the heating power of the heating wires on the one hand corresponds exactly to the cooling power caused by the cooling gas on the other hand, which causes a temperature gradient through the optical elements 601 but the temperature distribution in the centre of the optical element 601 is homogeneous.

As a result of heat being taken up from the optical elements 601 into the gas flow 602 in the flow channel 604, a temperature profile that influences the cooling power, on the one hand, and the optical action of the gas flow 602, on the other hand, is established along the gas flow 602. The cooling power of the gas flow 602 decreases along the flow channel 604 due to the smaller temperature difference—associated with the heating—of the gas flow 602 with respect to the optical elements 601; in addition, the heating is also responsible for a change in density of the gas flow 602 along its flow direction, whereby an optical action of the gas flow 602 which corresponds to that of a gradient-index lens is caused. In this case, the optical action of the gas layer on the wavefront corresponds predominantly to a phase offset and a phase tilt, wherein a homogeneous phase offset is not relevant for the optical imaging and a phase tilt in the range of a few nanometres can be compensated for by an additional, mechanical manipulator, which for example shifts or tilts an optical element. The diminishing cooling power of the gas flow 602 can be combated by the cross section of the flow channel 604 being reduced along the flow direction, such that the average flow rate and hence the cooling power of the gas flow 602 are increased.

The dimensions of the heating array can be chosen such that the relevant optical region is completely covered with heating zones, but furthermore a certain outer region is also covered with heating zones. The heating zones in the outer region make it possible, on the one hand, to exactly set the temperature profile also at the edge of the relevant optical region, and on the other hand heating zones also make it possible to comply with thermal boundary conditions of the optical element 601.

An exemplary thermal boundary condition at the edge of the optical element 601 consists in keeping the temperature at reference temperature, that is to say at the temperature provided for the entire objective, and choosing the projection of the temperature gradient onto the edge normal of the optical element 601 to be equal to zero. By virtue of the fact that the temperature of the edge is kept at reference temperature via suitable driving, the edge is at exactly the temperature of the structure 605 surrounding the optical element, the temperature of the structure likewise being exactly stabilized. Since the temperatures of structure and edge of the optical element 601 are kept exactly identical, no heat flow arises between optical element 601 and structure 605 even though the thermal decoupling by the mechanical linking and possibly narrow gaps is not perfect. Furthermore, the second boundary condition constrains the setting of only those temperature profiles which can be realized by the net heat balance in the heating zones. Since no further heat flows are involved, it is also not necessary to link the optical elements 601 to the structure 605 or to external thermal actuators via thermal bridges. This is particularly favourable because, in the case of thermal bridges, the thermal conductance usually competes with the mechanical stiffness, which is generally problematic with regard to possible deformations of the optical element 601.

Alternative exemplary embodiments with thermal linking of the optical elements 601 at the edge are conceivable, but involves a very careful design of the thermal bridges in order to achieve good reproducible thermal conductances in conjunction with low linking stiffness. Such a concept also becomes more complex in terms of closed-loop control technology since thermal elements now also have to be concomitantly included outside the optical elements in order to supervise the temperature profile of the optical elements 601 as well.

Temperature sensors are desired for accurately controlling the temperature of the optical element 601; an exemplary distribution of such temperature sensors 606 is indicated in FIG. 37. In a first exemplary embodiment, each heating zone is equipped with a temperature sensor 606. The temperature profile of the optical element 601 can then be controlled by an MiMo (Multiple Input Multiple Output) closed-loop control. In order to reduce the number of temperature sensors 606, it may also be advantageous to arrange the temperature sensors 606 on reduced or coarser grids than the heating zones. The arrangement of the temperature sensors within the heating zones means, however, that temperature sensors 606 and also their connecting wires (not illustrated) have to be arranged in the optically relevant region, which is critical with regard to scattered light and the homogeneity of the optical transmittance. Furthermore, it is desirable to implement a high-dimensional MiMo closed-loop control and to compute the high-dimensional N×N transfer matrices thereof (N=number of zones>100 . . . a few thousand) in real time with a sampling rate of tens of Hz, which is problematic with regard to the real-time performance and the numerical accuracy.

In one exemplary embodiment, therefore, only those thermal modes which have a long time constant and which are sensitive with regard to variations of the cooling power of the gas are controlled via feedback control. These are generally those thermal modes having the longest time constants. The temperature sensors 606 are optionally arranged in such a way that the thermal modes to be controlled can be observed well, temperature sensors 606 outside the optically free region being sufficient for measuring the modes. The arrangement of the temperature sensors 606 outside the free optical region is also favourable because the optical beam path cannot be disturbed as a result and, for this reason, the temperature sensors 606 can be optimally chosen, positioned and thermally linked according to the desired properties for the temperature measurement.

The neutral homogeneous temperature profile of the optical elements 601 is kept stable via the closed-loop control described above. The neutral homogeneous temperature profile of the optical elements 601 is understood to mean that profile which does not manifest an optical correction action or in the case of which the optical element 601 behaves largely neutrally in the subordinate system, such as e.g. a projection objective, with regard to the wavefront correction. In one exemplary embodiment, the closed-loop control is realized via a transformation of the sensor and actuator signals into largely decoupled degrees of freedom, the number of degrees of freedom being less than or equal to the number of temperature sensors 606. The decoupled degrees of freedom can thus be controlled independently (SiSo—Single input, Single output) e.g. via PI controllers or sliding-mode controllers. One exemplary embodiment of the decoupling transformation is the slow thermal eigenmodes of the optical elements 601.

The temperature profile for optical phase correction is impressed on the optical elements 601 optionally by power control of the heating zones. In particular, a temperature measurement in the optically free regions of the optical element 601 can be dispensed with for controlling the temperature profile for optical phase correction. Those temperature profiles in the optical elements 601 which are intended to be used for wavefront correction are determined on the basis of the measurement data of the image sensor, that is to say of that sensor which measures the wavefront at the wafer level, that is to say the last image plane of the projection exposure apparatus. Since all disturbing influences of the apparatus are manifested in the wavefront at the wafer level, this procedure for wavefront correction is particularly efficient.

For the abovementioned setting of the desired temperature profile for phase correction, it is advantageous to combine a so-called basis functions from the plurality of heating zones, from which functions the user can combine the desired correction profiles. The basis functions also permit thermal secondary conditions to be concomitantly taken into account. Favourable secondary conditions are that the power of all the heating zones associated with a basis function adds up to zero, that is to say that the basis functions are neutral with respect to the thermal power balance of the optical plates. Further favourable secondary conditions in relation to the basis functions are thermal boundary conditions at the edge of the optical element 606 or at the position of the temperature sensors 606. One exemplary embodiment of the basis functions is the heating of a heating zone with simultaneous cooling of the directly adjoining heating zones with symmetrical cooling power distribution. The advantage afforded by such a basis function is a temperature excursion that is as local as possible and hence good compliance with the secondary conditions.

In general, the temperature sensors 606 are excited by the basis functions, unless they were explicitly chosen such that the positions of the temperature sensors 606 are not excited thermally. If this is not the case, then one or more temperature sensors 606 undergo excursion as a result of the activation of a basis function. This would cause the controller to correspondingly effect counter-control and therefore displace the degrees of freedom to be controlled from the neutral position. In order to avoid this, it is advantageous to add the reaction of the controller to the basis profile. The new basis profile now behaves neutrally with respect to the closed-loop control of the boundary conditions. A further possibility consists in using a model that predicts the excitation of the temperature profile of the optical element 601 as a response to the application of the basis functions. Using this information, the temperature measured by the temperature sensors can be corrected by the temperature excursion introduced by the basis functions. What is achieved via this correction measure is that the basis functions impressed via control do not excite the controllers.

Since the thermal time constants of an optical element 601 manipulated in this way are of the order of magnitude of minutes, temporal progressions of temperature profiles cannot readily be controlled rapidly and precisely. The dynamic behaviour can be considerably improved via suitable pilot control. One exemplary embodiment consists in the pilot control signal being composed of two portions as follows: the first portion is the power profile desired for the steady-state setting of the desired temperature profile at the respective instant, the second portion is the heat flow involved to achieve the temperature increase in a volume associated with a heating zone since the average temperature in the volume is proportional to the heat stored therein. What is essential for this type of pilot control is that the first portion generates the lateral heat flow involved for maintaining the temperature profile, such that the heat introduced by the second portion can propagate exclusively in the axial direction indicated by the arrow 607 in FIG. 37. As a result, the optical action becomes independent of the axial propagation of the heat since, for a light beam in the axial direction, the optical path length is proportional to the temperature averaged in the axial direction. This in turn is proportional to the heat stored in the volume, the heat not changing by virtue of its exclusively axial propagation. Consequently, the optical action is established directly with this type of pilot control. It is delayed neither by lateral nor by axial time constants.

Precisely controlling temperature profiles presupposes accurately setting heat flows. The heat flow acting at a heating zone is composed of the impressed heating power of the respective heating zone and the cooling power of the cooling gas. Contrary to the heating power, which is accurately known by way of the electrical variables, the cooling power is dependent on the local surface temperature. In order to compensate for this effect, it is advantageous to implement a pilot control in such a way that it biases and thus compensates for the local change in the cooling power that is to be expected from the temperature profile set.

The feeding of the cooling gas flow 602 is optionally performed via an inlet channel 608 positioned upstream of the optical elements 601 in the flow direction. The inlet channel 608 forms a hydraulic and a thermal profile in the gas flow 602. This is advantageous in order to achieve a sufficiently homogeneous and temporally stable cooling power density at the interfaces 603 of the optical elements 601.

It is desirable, in particular, to arrange the optical elements 601 in a region of the gas flow 602 in which the cooling power decreases approximately linearly along the gas flow 602; the associated change in the gas temperature and the cooling power is readily controllable in terms of closed-loop control technology. In other words, those regions of the gas flow 602 in which the cooling power still decreases exponentially are moved into the region of the inlet channel 608. For this purpose, the length of the inlet channel 608 can be approximately 10-20 times the height of the flow channel 604.

A laminar or turbulent gas flow can be chosen depending on the desired properties, the turbulent flow affording the advantage of a higher cooling power density. A laminar gas flow 602, by contrast, affords better temporal stability and better robustness with respect to disturbances of the gas flow. The better temporal stability of the laminar gas flow 602 has the advantage that the already described optical effects of the gas flow 602 (gradient-index lines) can be combated more effectively via a suitable closed-loop or open-loop control.

In one exemplary embodiment, the hydraulic profile of the gas flow is formed partly or completely in a first adiabatic section of the inlet channel 608 before the thermal profile is formed in a second section with isothermal walls that are stabilized at reference temperature. This has the advantage that the hydraulic profile is largely formed before the thermal profile is formed and the thermal profile is therefore defined optimally.

As an alternative, however, hydraulic and thermal inlet can also be combined, which may be advantageous with regard to the desired structural space.

Mechanical excitation forces that act on the objective holders can lead to fading and/or overlay aberrations depending on the frequency range. For this reason, the permissible excitation forces are typically limited to the range of a few mN or less. This involves a careful design of the flow channels in order to avoid mechanical excitation by the gas flow.

In the exemplary embodiment shown in FIG. 37, the cooling gas is guided in the flow channel 604 with a constant cross section precisely through the objective. This minimizes the possibilities of excitation of the gas flow and reduces the force application areas in the flow direction to zero. Such a design affords optimum insensitivity with regard to temporal pressure and flow rate variations.

In an alternative exemplary embodiment illustrated schematically in FIG. 38, the gas flow 602 is deflected after passing through the optical elements 601 and returned to the entry side again. This has the advantage that the cooling power of the gas can also be utilized for other purposes, for example for controlling the temperature of the housing or for cooling electronic components. Moving all the connections onto one side is also advantageous with regard to mounting and service.

The elbow 609 is used for deflecting the gas flow. An advantageous design is an elbow having a continuous cross-sectional constriction, as illustrated in FIG. 38. By virtue of the acceleration of the gas flow 602 in the elbow 609, it is possible to avoid separations at the internal radius and the resultant turbulences.

As an alternative or in combination with the cross-sectional constriction, the exhaust channel 610 can be formed in the form of a Venturi nozzle, as illustrated in FIG. 39. This significantly reduces the separation risk, which is particularly high at the point where the internal radius merges into the exhaust channel 610.

In order to prevent possible distortions of the flow profile from going back through the elbow 609 into the optically relevant region, one or a plurality of restrictions 611 can be incorporated behind the optically relevant region. These flow resistances, which are constant across the channel cross-section, then mask the inhomogeneous pressure and velocity profile in the elbow 609. For the gas flow 602 in the optically relevant region, the restrictions 611 act like a very long straight channel. It can be imagined that the disturbing influence of the elbow 609 is shifted by the restrictions 611 virtually to the end of a very long channel, that is to say very far away, and the disturbing influence is thus suppressed in the optically relevant region.

In a further exemplary embodiment illustrated in FIG. 40, the gas flow 602 is divided into two, deflected via a pair 609' of elbows and returned via two separate channels 612. This is advantageous with regard to the symmetry of the flow configuration and with regard to the structural space. Furthermore, electronic components (not illustrated in figure) can then profit from the cooling power in both channels 612. The more uniform distribution of the cooling power, which also acts on the structure components, additionally facilitates the control of the structure temperature.

The above-described concepts for reversing the gas flow 602 may have the disadvantage, however, of the relatively high pressure drop of up to a few 100 Pa in the flow direction of the gas, for which the introduced restrictions 611 and the acceleration of the gas flow 602 are predominantly responsible. In an alternative exemplary embodiment of gas deflection, the gas is tapped off from the straight channel section via baffle plates 613 and guided around the curve; the baffle plates 613 are illustrated, e.g. in FIGS. 38 and 40. This gives rise to an arrangement of small tubes whose internal diameter is significantly smaller than the smallest radius of curvature, thereby precluding the risk of separation and also of centrifugal-force-induced transverse flow. The baffle plates 613 can be extended over the exhaust channel 610 and be used as cooling fins for the integrated electronic units. Via a suitable choice of channel length and cross section, the effective flow resistances and hence the dynamic pressure at the entry of all the channels can be coordinated at the same level. By virtue of the homogeneous flow resistance thereby obtained across the channel width, the restrictions 611 are unnecessary and the pressure drop is therefore significantly reduced.

The cold cooling gas manifests an unavoidable cooling power on all the channel walls. On account of this, with gas flow 602 switched on, the temperature of the gas channels incorporated into the structure 605 would fall within a short time to a gas temperature of typically 13° C. This would mean a considerable disturbance of the thermal equilibrium of the objective, the temperature of which is stabilized at a reference temperature of 22° C. with an accuracy of a few mK. Disturbances of the thermal equilibrium of the objective result in optical aberrations and drift effects, in which case severe disturbances of the thermal equilibrium can no longer be compensated for without performance and throughput loses on account of the large aberrations and the high drift velocity. For this reason, it is advantageous to configure the arrangement according to the disclosure such that it proves to be thermally neutral with regard to the objective into which it is integrated. This can be realized in a first exemplary embodiment by the channel walls being embodied in a thermally insulating fashion. This can be realized by suitably lining the channel walls with thermally insulating materials such as e.g. porous ceramics or plastic foams. As an alternative, however, it is also possible to apply thermoscanning principles, that is to say hollow chambers with vacuum or a suitable gas filling. What is disadvantageous about the passive thermal insulation is that corresponding insulation thicknesses in the range of a few cm are involved for efficient thermal insulation and a residual parasitic heat flow can never be completely suppressed. It is advantageous, therefore, to stabilize the structure and the channel walls actively via a suitable liquid such as water, for example, which is conducted through suitably applied holes or channels in the structure. In this case, the density of the cooling channels is optionally orientated towards the cooling power density of the gas in this region. However, stabilizing the temperature of the structure accurately to a few mK given an integral cooling power of the gas of typically 5-50 watts involves a relatively high water flow of a few 1/min. These flow rates can cause considerable mechanical excitation forces, however, and a separately controlled cooling circuit is generally desired for this purpose.

In one exemplary embodiment, therefore, the temperature stabilization of the channel walls is performed via area heating elements. The area heating elements are fitted for this purpose directly on the channel wall or closely underneath and counteract the heat loss caused by the cooling gas. Given suitable open-loop or closed-loop control, the area heating elements exactly compensate for the heat loss due to the cooling gas. Therefore, the thermal load of the cooling gas cannot act at all on the structure in the first place. This has the further advantage that temperature gradients in the structure and accompanying mechanical deformations thereof are avoided by design.

The area heating elements are optionally divided into a plurality of zones along the gas channel, such that local variations of the cooling power can be compensated for via a multizone closed-loop control. It is furthermore advantageous to design the area heating elements such that the distribution of the heating power density corresponds to the distribution of the cooling power density of the gas at the channel walls. Via temperature sensors such as NTCs or resistance temperature sensors, the temperature of the structure can be measured at suitable points and be controlled exactly via multizone closed-loop control in the mK range.

FIG. 41 illustrates a projection exposure apparatus 31 for semiconductor lithography, into which the optical elements described or the arrangement 600 according to the disclosure are integrated. This serves for exposing structures onto a substrate coated with photosensitive materials, which substrate is generally composed predominantly of silicon and designated as wafer 32, for producing semiconductor components, such as e.g. computer chips.

In this case, the projection exposure apparatus 31 essentially includes an illumination device 33, a device 34 for receiving and exactly positioning a mask provided with a structure, a so-called reticle 35, which determines the later structures on the wafer 32, a device 36 for mounting, moving and exactly positioning precisely the wafer 32, and an imaging device, namely a projection objective 37, including a plurality of optical elements 38 which are mounted in an objective housing 40 of the projection objective 37 via holders 39. In this case, an optical element or an optical correction device according to the disclosure can be arranged at any desired location in the projection objective 37 or else in the illumination device 33.

In this case, the basic functional principle provides for the structures introduced into the reticle 35 to be imaged onto the wafer 32; the imaging is generally performed in demagnifying fashion.

After exposure has been effected, the wafer 32 is moved further in the arrow direction, such that a multiplicity of individual fields, each having the structure prescribed by the reticle 35, are exposed on the same wafer 32. On account of the step-by-step advancing movement of the wafer 32 in the projection exposure apparatus 31, the latter is often also referred to as a stepper.

The illumination device 33 provides a projection beam 41 involved with the imaging of the reticle 35 on the wafer 32, for example light or a similar electromagnetic radiation. A laser or the like can be used as a source for this radiation. The radiation is shaped in the illumination device 33 via optical elements in such a way that the projection beam 41, upon impinging on the reticle 35, has the desired properties with regard to diameter, polarization, shape of the wavefront and the like.

Via the beams 41, an image of the reticle 35 is generated and transferred to the wafer 32 in correspondingly demagnified fashion by the projection objective 37, as has already been explained above. The projection objective 37 has a multiplicity of individual refractive, diffractive and/or reflective optical elements 38 such as e.g. lenses, mirrors, prisms, terminating plates and the like.

FIG. 42 shows a thermal equivalent circuit diagram of one of the principles underlying the disclosure. In this case, the optical element 1010 is modelled as a combination of thermal resistivities 1011 and specific heat capacities 1012 via which heat is emitted or taken up or in which heat is stored. In this case, the taking up and emission of heat into and from the optical element 1010 is symbolized by the double arrow 1007. Heat is fed to the modelled system in a controllable manner via the heating system 1002 continuously via the thermal coupling 1004, which is represented via the arrow 1006. At the same time, heat is continuously drawn from the system in the direction of the internal heat sink 1005 and subsequently via the external heat sink 1009 via the thermal resistor 1003, which is illustrated via the arrow 1008. The direction of the heat flow symbolized by the arrow 1007 is dependent, then, on whether the heat loss in the direction of the heat sinks 1005 and 1009 is over- or undercompensated or precisely compensated for by the heat supply from the heating system 1002. In other words, even with other parameters constant, it is possible to determine solely via the control of the heat source 1002 whether the optical element is locally kept at a temperature, heated or cooled.

Possibilities will be considered below via which the so-called spurious light caused by the optical elements according to the disclosure or by scattering or diffraction at the conductor tracks of thermal actuators can be reduced:

Spurious light—or synonymously called stray light—is typically light whose propagation direction at the diffraction location deviates from the design direction, that is to say from the direction provided for the optical useful radiation. If the diffraction takes place near the pupil, then this change in direction is translated into a positional change in the image, which leads to so-called double or ghost images.

Spurious light can be absorbed when it passes through locations not met by any design beam path. The locations are optionally in the region of intermediate images, if the spurious light is generated near the pupil, and pupil regions for spurious light generated near the field. According to the disclosure, diffractively acting correction means are intended to be combined with spurious light diaphragms at these corresponding locations. For the case where the optical element according to the disclosure is positioned upstream of a first intermediate image in the light direction in an optical system such as e.g. in a projection objective, a spurious light diaphragm in the vicinity of the intermediate image may be advantageous.

An exemplary method for designing such spurious light diaphragms includes the following steps:
1. Designing the optical correction element
2. Determining its diffractive action
3. Calculating the design beam path and also the light paths of the diffracted light through the system. This can be done for instance by positioning test areas in the context of a ray-based simulation in the system and calculating in each case those regions on the test areas on which useful radiation and spurious light pass through.
4. Determining objective regions through which spurious light passes but useful light does not pass. This can be done by forming the differential sets of the test area regions described in point 3.
5. Testing whether these objective regions are suitable for positioning spurious light diaphragms. If appropriate providing a spurious light diaphragm at these locations.

By designing and positioning the spurious light diaphragms, therefore, essentially the following conditions are intended to be met:
light in the design beam path passes completely outside the spurious light diaphragm
at least one portion of the light which is diffracted upon regular irradiation by the conductor tracks or the thermal actuators impinges on the spurious light diaphragm.

If a projection objective is involved whose field centre does not lie on the optical axis (abaxial field), as is often desirable in catadioptric systems, then "natural" spurious light diaphragms are present under certain circumstances, for instance if the light has to pass through perforations through optical elements. Such elements may be mirrors which, for mechanical and production-technological reasons, are embodied as largely rotationally symmetrical parts that are arranged in an objective region in which the beam path is folded. The mirrors desirably then reflect in certain regions, but at other locations transmit the light through the solid body, that is to say have a perforation. The perforation can be configured in such a way that the useful radiation can largely pass through but spurious light is at least partly absorbed.

Furthermore, mirror regions that do not see any useful radiation can be designed to be non-reflective or to have low reflectivity, in order to absorb spurious light impinging there. It is an analogously possible to have absorbing regions or regions effecting scattering into the holder at refractive elements which have a separation of regions through which useful radiation and spurious light pass (absorption or scattering where spurious light but not useful radiation is expected).

The systems with an abaxial field discussed may exhibit the case where the field is greater in one specific direction than in the orthogonal direction. Spurious light can correspondingly be absorbed more easily in this orthogonal "short" direction than perpendicularly thereto. If there is a choice when designing the conductor tracks, for instance in the orientation of the structures, then a variant will optionally be chosen in which the light is diffracted (perpendicular to the orientation) in the direction of the short field axis, where it is absorbed more easily. If e.g. the field of a scanner is wider perpendicular to the scanning direction than in the scanning direction, then rectilinear conductor tracks should be oriented if possible perpendicular to the scanning direction. They will then effect diffraction in the scanning direction, the utilized field (and hence a possibly following intermediate image) is narrow there, and the surrounding region can be provided with a mechanical diaphragm or be blackened in some other way in order to absorb diffracted light.

One advantageous variant of the disclosure consists in positioning the optical element according to the disclosure in or near a pupil plane, while the spurious light diaphragm is placed nearer the field and is fitted laterally alongside the design beam path at least partly in the direction of the short field direction.

The use of at least one aperture diaphragm arranged downstream of the optical element according to the disclosure in the light direction also constitutes an effective possibility for suppressing spurious light.

Provided that the region is accessible, the last area of an optical projection objective often also constitutes an excellent location where spurious light can be absorbed.

Further alternative forms of realization of the optical elements according to the disclosure will be presented below:

For applying the conductor tracks or the thermal actuators, plane-parallel plates as optical elements constitute an advantageous choice. An alternative to this consists in arranging the conductor tracks or the thermal actuators on curved, if appropriate aspherical areas. In this case, the curved surfaces can exhibit a radius of curvature of less than 10 000 mm, such as less than 5000 mm. This need not necessarily clash with production on plane areas: within limits it is possible to wring one element onto another curved element and process and structure them in plane fashion. The curved, structured surface form will be established after the release from wringing. Reasons for arranging the conductor tracks or the thermal actuators on curved areas may include lack of structural space in the expedient subaperture region or a desired amplification of the change in refractive index at limited power because a high degree of beam deflection takes place in the relevant region and the relevant element thereby reacts particularly sensitively to changes in the refractive index.

Furthermore, optical elements can be divided between different individual elements for other reasons and present themselves, by virtue of this division that is involved anyway, as carriers of correction means such as e.g. conductor tracks or thermal actuators.

The use of crystalline optical materials such as calcium fluoride, barium fluoride, other fluorides, LuAG (lutetium aluminium garnet) or spinel which exhibit intrinsic birefringence in the ultraviolet range is also conceivable for realizing the optical element according to the disclosure. It is advantageous if the material used has an intrinsic birefringence of at least 2 nm/cm at the operating wavelength.

In order that the resulting birefringence in the system is kept small, it has already been proposed to split these elements into partial elements having a different crystal orientation and a different rotational position about the optical axis in such a way that the summational effect does not exceed tolerable limits.

By way of example, the crystallographic principal axes in the [100], [111] or [110] direction can be oriented in the direction of the optical axis of the system; the corresponding compensation schemes are found variously in the literature.

In modern lithography objectives, dipole applications constitute a critical area of use. They influence the pupil essentially in a strip, while no disturbance occurs in the orthogonal strip (apart from the centre). If, given limited driving possibilities, one would like to draw on this case particularly well, it can expedient for the local influencing zones to be chosen to have different sizes. In a strip where dipole applications will generate steep gradients in accordance with the illumination widths used, a very fine subdivision of the conductor tracks or the thermal actuators is chosen. They are coarsened outside the strip. If the optical element according to the disclosure is then also designed such that it is rotatable about the optical axis, then dipoles having different orientations can be corrected as well as possible in terms of lens heating influence for given driving. This concept can also be applied to CQuad/Quasar applications where a cruciform region is correspondingly driven more finely than the rest.

In general terms, the structures formed from the conductor tracks or the thermal manipulators can be designed more finely in a strip-type region than in the remaining region, whereby a higher spatial resolution of the temperature profile can be realized in the strip-type region than outside the latter.

In an alternative variant of the disclosure it is also conceivable to use the unavoidable diffraction effects caused by the conductor tracks or the thermal actuators as desired diffractive optical effects. In other words, the conductor structure applied on the optical element would have both a desired optical action and a desired thermal action.

Correction strategies for the design or application of the optical elements according to the disclosure:

For the correction strategies for the design or application of the optical elements according to the disclosure it should be taken into consideration, in particular, that their correction potential is limited since, by way of example, the maximum permissible current represents a limiting factor. Therefore, it is advantageous to combine the optical elements according to the disclosure with conventional manipulators (wavelength, gas composition, gas pressure and gas temperature, rigid body movements of optical elements or the flexure thereof from the edge) and to carry out the travel-intensive coarse tuning with these conventional manipulators, whereas only finer corrections should be effected via the optical elements according to the disclosure. If it is known that certain correction degrees of freedom can be excited in principle in both directions, yet are desired only in one direction, then it is possible to generate in the system (either at the optical element according to the disclosure itself or at some other optical part at an equivalent subaperture position) a bias in the desired direction for instance by aspherization, such that the zero state is already produced by movement of the manipulator in the otherwise useless correction direction. The desired correction action can then be achieved by movement of the manipulator back from this "useless" correction direction. This procedure has the advantage that a doubled adjustment range available in particular for a wavefront correction results in comparison with a procedure without the abovementioned bias.

In order to compensate for production variations, it is expedient to calibrate the optical element according to the disclosure or to create a calibration data record at the beginning For this purpose, the individual local regions are driven with defined intensity and the resulting influence on the wavefront is measured interoferometrically. On the basis of this information, the local regions are later driven in such a way that a highly accurate optical action of the local temperature changes is obtained.

If the optical element according to the disclosure is designed as an exchangeable part, two strategies can be pursued upon exchange: either the optical element itself corrects its difference with respect to the predecessor part (and also irreversible system alterations that have additionally occurred in the meantime, e.g. as a result of drift or compaction of other parts), which costs correction potential. As an alternative, this systematic known portion can be impressed on the optical element by aspherization.

If the optical element is embodied as a plane-parallel plate, it may be expedient to design the optical element such that it is displaceable in a divergent beam path along the optical axis. As a result of a displacement along the optical axis, the subaperture ratios then change appreciably on account of the divergent beam path, such that the optical element can operate in each case in the optimum region for the system state. Such a displacement can be expedient when, for instance, lifetime and lens heating effects are dominant in different subaperture ranges and cause disturbance with different weights depending on the utilization and duration for which the system has already been use. In general, the optical element can additionally be variable in terms of its position (decentring, tilting optionally about an axis parallel or perpendicular to the optical axis, rotation) and/or be designed in particular to be able to undergo astigmatic, three-leaf or four-leaf clover deformation (in the context of the loading limits of the conductor tracks or thermal actuators). The abovementioned displacements of the rotations/tilting of the optical element can also be provided, of course, when the optical element is situated in a non-divergent part of the beam path.

If the system is utilized in different operating modes, of which a first mode generates e.g. little lens heating but reacts sensitivity to spurious light, while a second operating mode generates great heating effects but is more tolerant towards spurious light, it may be expedient to provide a rapid exchange of the optical element according to the disclosure for an optical element which is unstructured and has the same desired optical action as the non-driven optical element according to the disclosure. While the optical element that is unstructured and therefore generates no spurious light would be pivoted into the beam path in the first operating mode, in the transition to the second mode it would be replaced by an optical element whose correction potential would keep the system within specification despite the heating.

It is advantageous, therefore, if the optical element according to the disclosure is designed in such a way that it can be exchanged by the end customer, that is to say in particular is held in a mechanical interchangeable holder and precautions are taken for simple accessibility.

In order to be able to expediently move the optical element, the disturbance to be corrected is desirably known as precisely as possible. This information can be obtained from frequent system measurement in a first case. This reduces the throughput, however. As an alternative to this, in a second case, with irradiation that is constant on an average over time, it is possible to extrapolate to the absorbed quantity of light and the temperature distribution established, and the temporally developing image aberrations can be calculated therefrom and used as a basis of a correction. In this case, the extrapolations can either be based on fast simulation calculations at the same time or be carried out on the basis of previous calibrations. In any event measurements should then optionally be carried out at relatively short intervals if the irradiation changes, e.g. directly after a reticle and/or illumination change has taken place. After such a case, the temporal development will proceed particularly rapidly, such that in the first case the frequency of the system measurements can be adapted to the time interval with respect to the last change in irradiation and the system time constants (known at the outset by calculation or measurement). If the system approaches the static state ("goes to saturation"), measurement has to be effected less frequently and the throughput correspondingly increases.

Some optional positions of the optical elements according to the disclosure or of the arrangement according to the disclosure in the system will be explained by way of example below. In this case, the so-called paraxial subaperture ratio serves as a measure of position in the optical system.

The paraxial subaperture ratio is given by $$\frac{r}{|h|+|r|} \operatorname{sgn} h$$

where r denotes the paraxial marginal ray height, h denotes the paraxial principal ray height and the signum function sign x denotes the sign of x, where sgn0=1 shall be declared. A definition of the paraxial marginal ray and paraxial principal ray is given in "Fundamental Optical Design" by Michael J. Kidger, SPIE PRESS, Bellingham, Wash., USA, which is incorporated by reference herein.

The paraxial subaperture ratio is a signed value that is a measure of the field or pupil proximity of the position of a plane in the beam path. The paraxial subaperture ratio is normalized by definition to values of between −1 and 1, a zero of the paraxial subaperture ratio corresponding to each field plane, and a discontinuity with a jump in the paraxial subaperture ratio from −1 to +1 or from +1 to −1 corresponding to each pupil plane. For the present application, paraxial subaperture ratios of 0 correspondingly denote field planes, while a paraxial subaperture ratio in terms of magnitude of 1 determines a pupil plane.

Planes near the field therefore have paraxial subaperture ratios that are close to 0, while planes near the pupil have paraxial subaperture ratios that are close to 1 in terms of magnitude. The sign of the paraxial subaperture ratio indicates the position of the plane before or behind a reference plane. By way of example, the sign of the piercing point of a coma ray in the relevant area can be used for definition.

Two planes in the beam path are called conjugate if they have the same paraxial subaperture ratio. Pupil planes are conjugate to one another, as are field planes.

The paraxial subaperture ratio of an optical element is to be understand by the paraxial subaperture ratio of a plane located at the position of the optical element. For optical elements which are thin with respect to the overall length of the entire optical system this position of an associated plane is well defined.

In this case, the optical elements according to the disclosure or the arrangement according to the disclosure can advantageously be arranged at a location in the system at which the absolute value of the paraxial subaperture ratio for the element or for the arrangement is greater than 0.8, such as greater than 0.9. In addition, a further optical element according to the disclosure or a further arrangement according to the disclosure can be present for which the absolute value of the paraxial subaperture ratio is less than 0.9, such as less than 0.8. In addition or as an alternative, a further optical element according to the disclosure or a further arrangement according to the disclosure can be present for which the absolute value of the paraxial subaperture ratio is less than 0.9, such as less than 0.8.

In this case, the sign of the paraxial subaperture ratio of the further optical element or of the further optical arrangement should be chosen to be opposite to the sign of the second optical element or of the second optical arrangement.

For the spacings of the optical elements according to the disclosure or of the arrangements according to the disclosure in the system, it is advantageous to arrange a first element near the pupil, i.e. with a magnitude of the paraxial subaperture ratio of greater than 0.8 or optionally 0.9, and to arrange the second element at a distance which, expressed by way of the paraxial subaperture ratio, is 0.15, such as 0.3.

For two optical elements according to the disclosure which are arranged at different locations in the system, it is advantageous if the respective paraxial subaperture ratios differ from one another by at least 0.15, such as 0.3.

It goes without saying that all of the above-described optical elements, devices and arrangements according to the disclosure, their configurations, applications and locations in the system can be combined as desired.

What is claimed is:

1. An optical correction device, comprising:
   a first optical element having a first side and a second side opposite the first side;
   a second optical element having a side, the first side of the first optical element and the side of the second optical element defining a flow channel configured so that a cooling medium can flow therethrough; and
   thermal actuators configured to influence a temperature distribution in the optical correction device, wherein:
   (i) the thermal actuators comprise first and second heating arrays, the first heating array being disposed on the first optical element at an interface facing the flow channel, and the second heating array being disposed on the second optical element at an interface facing the flow channel; or
   (ii) the thermal actuators comprise a heating array disposed on the second side of the first optical element, and
   wherein the optical correction device has an inlet channel upstream of the first and second optical elements in a flow direction of the cooling medium, the inlet channel is configured to feed the flow of the cooling medium, and a length of the inlet channel is approximately 10 to 20 times a height of the flow channel.

2. The optical correction device of claim 1, wherein the thermal actuators comprise the first and second heating arrays.

3. The optical correction device of claim 1, wherein the thermal actuators comprise heating arrays comprising wires, the heating arrays have heating zones, and each heating zone has a heating current that is set individually.

4. The optical correction device of claim 1, wherein the optical correction device has an adiabatic section of the inlet channel configured to at least partly form a hydraulic profile of the flow of the cooling medium, and the optical correction device has a second section with isothermal walls stabilized at reference temperature to form a thermal profile of the flow.

5. The optical correction device of claim 4, wherein the inlet channel forms the hydraulic and thermal profiles.

6. The optical correction device of claim 1, wherein the thermal actuators form heating arrays having heating zones formed of conductor tracks comprising an alternate arrangement of sections of feeder wires and heating wires.

7. The optical correction device of claim 6, wherein:
   on one side of the heating array feeder wires are combined at a common busbar;
   on an opposite side of the heating array conductor tracks, which are assigned to the same heating zone, are combined via bridges; and
   the bridges are realized with the aid of a second level with conductor structures electrically insulated from a first level with the conductor tracks via a dielectric.

8. The optical correction device of claim 6, further comprising a flexible conductor film providing an electrical connection, wherein a S form or a plurality of undulations similar to a bellows are impressed in the flexible conductor film.

9. The optical correction device of claim 6, wherein the conductor tracks are embedded on the first optical element into a layer an optically transparent dielectric.

10. The optical correction device of claim 6, wherein the cooling medium is a gas or a liquid.

11. An apparatus, comprising:
the optical correction device of claim 1,
wherein the apparatus is a projection exposure apparatus.

12. The apparatus of claim 11, further comprising a diaphragm, wherein the apparatus has an intermediate image, the optical correction device is upstream of the intermediate image in a light propagation direction, and the diaphragm is in the vicinity of the intermediate image.

13. The apparatus of claim 12, further comprising optical elements having perforations configured to pass light, and the perforations are configured so that useful radiation can largely pass through but spurious light is at least partly absorbed.

14. The apparatus of claim 12, wherein the optical correction device is in or near a pupil plane, the diaphragm is closer to a field, and the diaphragm is fitted laterally alongside a design beam path at least partly in the direction of a short field direction.

15. The apparatus of claim 11, further comprising a diaphragm downstream of the optical correction device in a light propagation direction.

16. The apparatus of claim 11, further comprising:
a projection objective comprising a diaphragm configured to suppress spurious light,
wherein the diaphragm is in a last area of an optical projection objective.

17. The apparatus of claim 11, wherein the thermal actuators comprise a heating array disposed on the second side of the first optical element.

18. The apparatus of claim 11, wherein the thermal actuators comprise first and second heating arrays, the first heating array is disposed on the first optical element at an interface facing the flow channel, and the second heating array is disposed on the second optical element at an interface facing the flow channel.

19. The optical correction device of claim 1, wherein the thermal actuators comprise first and second heating arrays, the first heating array is disposed on the first optical element at an interface facing the flow channel, and the second heating array is disposed on the second optical element at an interface facing the flow channel.

20. The optical correction device of claim 1, wherein the thermal actuators comprise a heating array disposed on the second side of the first optical element.

* * * * *

UNITED STATES PATENT AND TRADEMARK OFFICE
CERTIFICATE OF CORRECTION

PATENT NO. : 8,325,322 B2  
APPLICATION NO. : 12/700122  
DATED : December 4, 2012  
INVENTOR(S) : Markus Hauf Page 1 of 1

It is certified that error appears in the above-identified patent and that said Letters Patent is hereby corrected as shown below:

Column 6,  
Line 22-23, delete "constructured" and insert --constructed--

Column 12,  
Line 60, delete "$R_{hear}$" and insert --$R_{heat}$--

Column 13,  
Line 17, delete "resisitivities" and insert --resistivities--

Column 15,  
Line 17, delete "aniosotropically" and insert --anisotropically--

Column 29,  
Line 9, delete "element" and insert --element.--

Column 29,  
Line 10, delete "action" and insert --action.--

Column 31,  
Line 55, delete "beginning" and insert --beginning.--

Column 31,  
Line 58, delete "interoferometrically." and insert --interferometrically.--

Column 32,  
Line 16, delete "(decentring," and insert --(decentering,--

Signed and Sealed this  
Twelfth Day of March, 2013

Teresa Stanek Rea  
*Acting Director of the United States Patent and Trademark Office*